United States Patent
Yim

(10) Patent No.: US 12,058,885 B2
(45) Date of Patent: Aug. 6, 2024

(54) DISPLAY DEVICE INCLUDING COMPENSATION LAYER

(71) Applicant: SAMSUNG DISPLAY CO., LTD., Yongin-si (KR)

(72) Inventor: Taekyung Yim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 285 days.

(21) Appl. No.: 17/473,824

(22) Filed: Sep. 13, 2021

(65) Prior Publication Data

US 2022/0199958 A1 Jun. 23, 2022

(30) Foreign Application Priority Data

Dec. 23, 2020 (KR) .................. 10-2020-0181960

(51) Int. Cl.
| | |
|---|---|
| *H10K 50/84* | (2023.01) |
| *H10K 50/844* | (2023.01) |
| *H10K 50/86* | (2023.01) |
| *H10K 59/12* | (2023.01) |
| *H10K 59/40* | (2023.01) |
| *H10K 59/65* | (2023.01) |
| *G02F 1/1333* | (2006.01) |
| *G06F 3/041* | (2006.01) |

(Continued)

(52) U.S. Cl.
CPC .......... *H10K 50/86* (2023.02); *H10K 50/844* (2023.02); *H10K 50/865* (2023.02); *H10K 59/12* (2023.02); *H10K 59/40* (2023.02); *H10K 59/65* (2023.02); *G02F 1/133331* (2021.01); *G06F 3/0412* (2013.01); *H05K 2201/09909* (2013.01); *H10K 50/8426* (2023.02); *H10K 50/868* (2023.02); *H10K 59/38* (2023.02)

(58) Field of Classification Search
CPC .... H10K 50/86; H10K 50/844; H10K 50/865; H10K 50/84; H10K 50/8426; H10K 50/868; H10K 59/12; H10K 59/40; H10K 59/65; H10K 59/38; H05K 2201/09909; G02F 1/133331; G06F 3/0412
See application file for complete search history.

(56) References Cited

U.S. PATENT DOCUMENTS

| 9,595,572 B2 | 3/2017 | Lee et al. |
| 10,497,896 B2 | 12/2019 | Lee et al. |

(Continued)

FOREIGN PATENT DOCUMENTS

| CN | 110010665 | 7/2019 | |
| EP | 3660640 A1 * | 6/2020 | ............ G01N 27/24 |

(Continued)

*Primary Examiner* — Ida M Soward
(74) *Attorney, Agent, or Firm* — F. CHAU & ASSOCIATES, LLC

(57) ABSTRACT

A display device includes a display panel that includes a first area and a second area that surrounds at least a portion of the first area. The display panel includes a base layer, a display element layer disposed on the base layer in the second area, an encapsulation layer disposed on the display element layer and that includes an opening portion that corresponds to the first area and an inclined portion that has a height that decreases with decreasing distance from the opening portion, and an inclination compensation layer that is disposed on the inclined portion and does not overlap the opening portion.

18 Claims, 13 Drawing Sheets

(51) Int. Cl.
    *H10K 50/80*     (2023.01)
    *H10K 50/842*    (2023.01)
    *H10K 59/38*     (2023.01)

(56) References Cited

U.S. PATENT DOCUMENTS

| | | | |
|---|---|---|---|
| 11,329,070 B2 | 5/2022 | Park et al. | |
| 2018/0061899 A1* | 3/2018 | Oh | G06F 3/0412 |
| 2020/0004365 A1* | 1/2020 | Shin | G06F 3/0418 |
| 2020/0161395 A1* | 5/2020 | Kim | H10K 59/122 |
| 2020/0161582 A1* | 5/2020 | Choi | G06F 3/042 |
| 2020/0194727 A1* | 6/2020 | Kim | H10K 50/858 |
| 2020/0212115 A1 | 7/2020 | Choi et al. | |
| 2020/0227489 A1* | 7/2020 | Kim | H10K 59/122 |
| 2020/0243802 A1 | 7/2020 | Ju et al. | |
| 2020/0328257 A1* | 10/2020 | Kim | H10K 50/15 |
| 2021/0057505 A1* | 2/2021 | Lee | H10K 59/131 |

FOREIGN PATENT DOCUMENTS

| | | |
|---|---|---|
| KR | 10-2012-0092907 A | 8/2012 |
| KR | 10-2019-0009147 A | 1/2019 |
| KR | 10-2020-0060594 A | 6/2020 |
| KR | 10-2020-0081628 | 7/2020 |
| KR | 10-2020-0092533 | 8/2020 |
| KR | 10-2020-0097374 A | 8/2020 |

\* cited by examiner

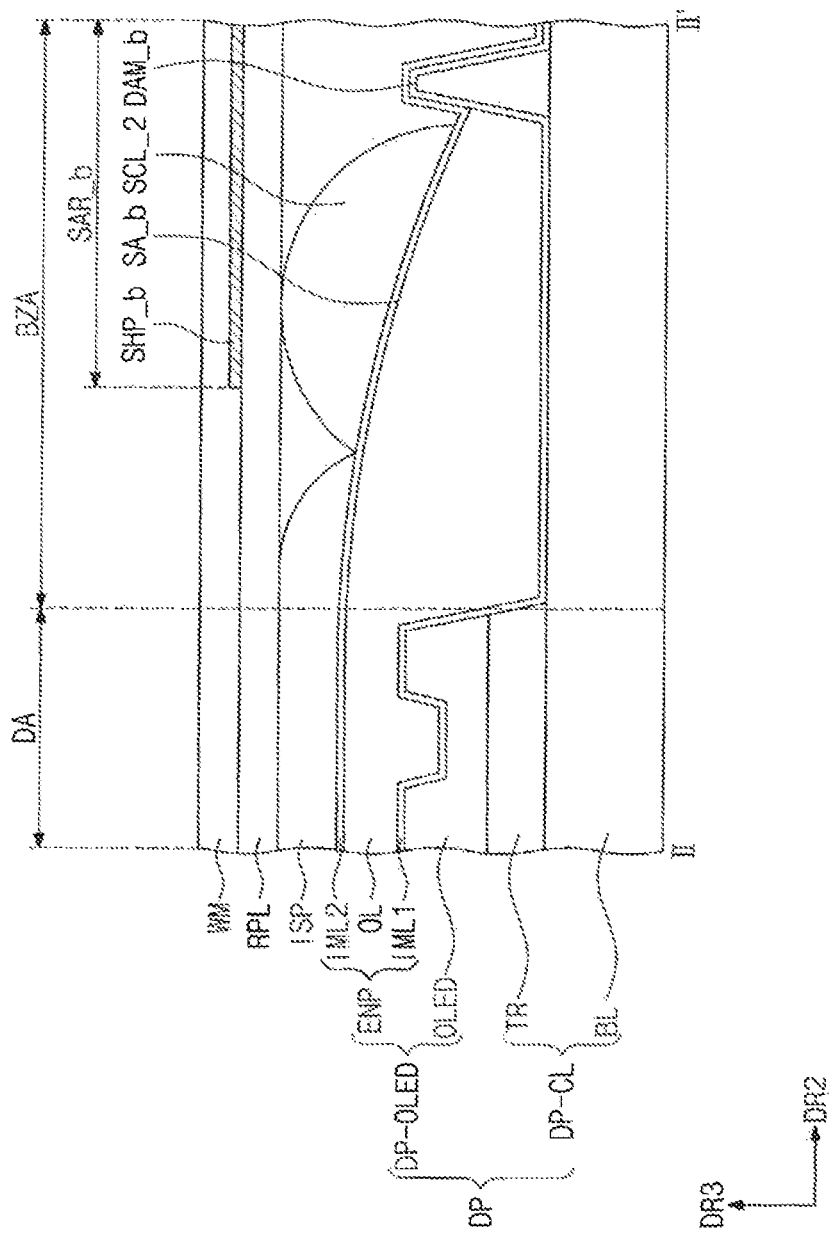

DISPLAY DEVICE INCLUDING COMPENSATION LAYER

CROSS-REFERENCE TO RELATED APPLICATION

This U.S. non-provisional patent application claims priority under 35 U.S.C. § 119 from Korean Patent Application No. 10-2020-0181960, filed on Dec. 23, 2020 in the Korean Intellectual Property Office, the contents of which are herein incorporated by reference in their entirety.

1. TECHNICAL FIELD

Embodiments of the present disclosure are directed to a display device. More particularly, embodiments of the present disclosure are directed to a display device capable of preventing external light from being reflected.

2. DISCUSSION OF THE RELATED ART

Various types of display devices that include a display module are being developed to provide image information. A display device typically includes an electronic module that receives external signals or provides output signals to an external device. For example, an electronic module may be a camera module, and demand for display devices capable of obtaining high-quality photographed images are increasing.

Meanwhile, issues of increasing an area in a display device in which both an image is displayed and a camera module is placed, and improving photographic image quality, are being studied.

SUMMARY

Embodiments of the present disclosure provide a display device that has improved visibility by preventing external light incident thereto from being reflected.

Embodiments of the inventive concept provide a display device that includes a display panel that includes a first area and a second area that surrounds at least a portion of the first area. The display panel includes a base layer, a display element layer disposed on the base layer in the second area, an encapsulation layer disposed on the display element layer and that includes an opening portion that corresponds to the first area and an inclined portion that has a height that decreases with decreasing distance from the opening portion, and an inclination compensation layer that is disposed on the inclined portion and does not overlap the opening portion.

In an embodiment, the encapsulation layer includes a first inorganic layer disposed on the display element layer, an organic layer disposed on the first inorganic layer, and a second inorganic layer disposed on the organic layer. The inclined portion is formed by the organic layer.

In an embodiment, the inclination compensation layer is disposed on the second inorganic layer.

In an embodiment, the display panel further includes a dam layer disposed on the base layer in the first area and that defines an area in which the organic layer is disposed, and the inclination compensation layer does not overlap the dam layer.

In an embodiment, the inclination compensation layer has a thickness that increases as with decreasing height of the inclined portion.

In an embodiment, the display panel further includes a planarization layer disposed in the first area on the encapsulation layer and the inclination compensation layer.

In an embodiment, the display device further includes a light blocking pattern. The display panel includes a panel hole formed in the opening portion, and the light blocking pattern is disposed in the first area and does not overlap the panel hole.

In an embodiment, the inclination compensation layer overlaps a portion of the light blocking pattern.

Embodiments of the inventive concept provide a display device that includes a display panel that includes a first area and a second area that surrounds at least a portion of the first area. The display panel includes a base layer, a display element layer disposed on the base layer in the second area, an encapsulation layer disposed on the display element layer and that includes an opening portion that corresponds to the first area and an inclined portion that has a height that decreases as decreasing distance from the opening portion, and an optical compensation layer disposed along the inclined portion and that does not overlap the opening portion.

In an embodiment, the encapsulation layer includes a first inorganic layer disposed on the display element layer, an organic layer disposed on the first inorganic layer, and a second inorganic layer disposed on the organic layer. The inclined portion is formed by the organic layer.

In an embodiment, the optical compensation layer is disposed on the second inorganic layer.

In an embodiment, the display panel further includes a planarization layer disposed in the first area on the encapsulation layer and the optical compensation layer.

In an embodiment, the optical compensation layer includes a transparent conductive material.

In an embodiment, the optical compensation layer includes indium zinc oxide.

In an embodiment, the optical compensation layer includes a metal.

In an embodiment, the optical compensation layer includes titanium.

Embodiments of the inventive concept provide a display device that includes a display panel that includes a display area in which an image is displayed and a non-display area adjacent to the display area. The display panel includes a base layer, a display element layer disposed on the base layer in the display area, an encapsulation layer disposed on the display element layer and that includes an inclined portion in the non-display area, and an inclination compensation layer disposed in the non-display area and that overlaps the inclined portion. The encapsulation layer includes a first inorganic layer disposed on the display element layer, an organic layer disposed on the first inorganic layer, and a second inorganic layer disposed on the organic layer. The inclined portion is formed by the organic layer, and the inclination compensation layer is disposed on the second inorganic layer.

In an embodiment, the display panel further includes a dam layer disposed on the base layer in the non-display area and that defines an area in which the organic layer is disposed, and the inclination compensation layer does not overlap the dam layer.

In an embodiment, the inclined portion has a height that decreases decreasing distance between the inclined portion and the dam layer, and the inclination compensation layer has a thickness that increases with decreasing height of the inclined portion.

In an embodiment, the display device further includes an input sensor layer disposed directly on the encapsulation layer.

According to the above, external light incident to the display device is prevented from being reflected and being perceived by a user, and thus, visibility of an image is improved. In detail, even though a camera module is disposed in an area where the image is displayed, external light incident to a periphery of the area where the camera module is disposed is prevented from being reflected and being perceived by the user.

BRIEF DESCRIPTION OF THE DRAWINGS

FIG. 11 is a cross-sectional view taken along a line II-II' in FIG. 2.

DETAILED DESCRIPTION

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout.

Hereinafter, embodiments of the present disclosure will be described in detail with reference to the accompanying drawings.

Figure 1:
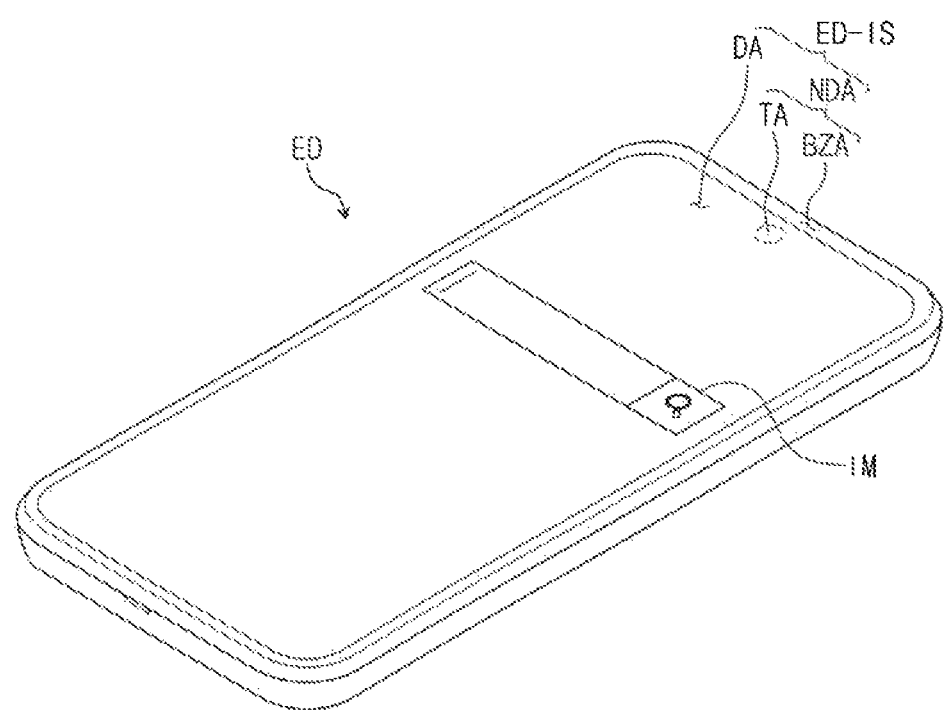
FIG. 1 is a perspective view of an electronic device according to an embodiment of the present disclosure.
Figure 1:
Figure 2:
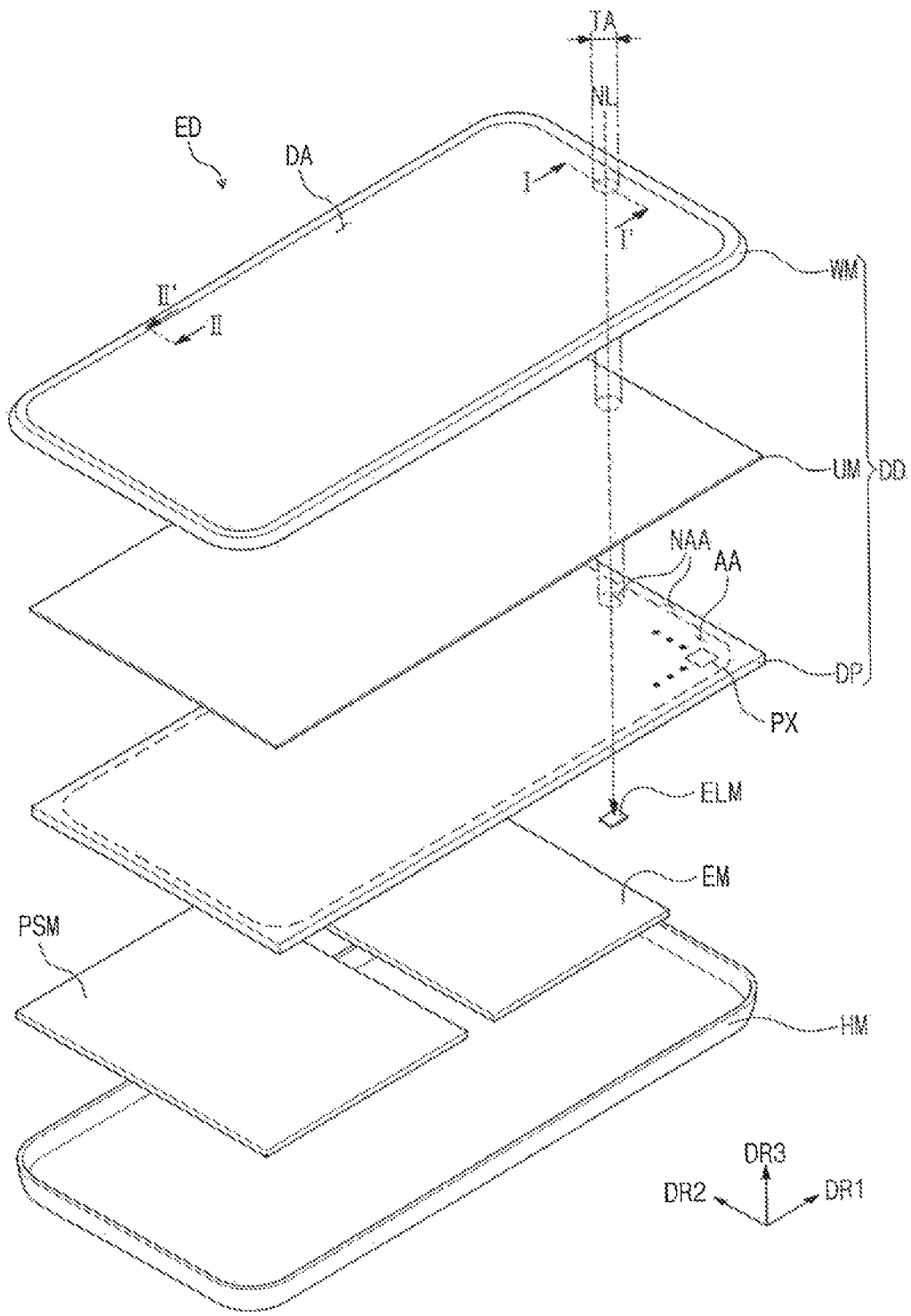
FIG. 2 is an exploded perspective view of an electronic device according to an embodiment of the present disclosure.
Figure 3:
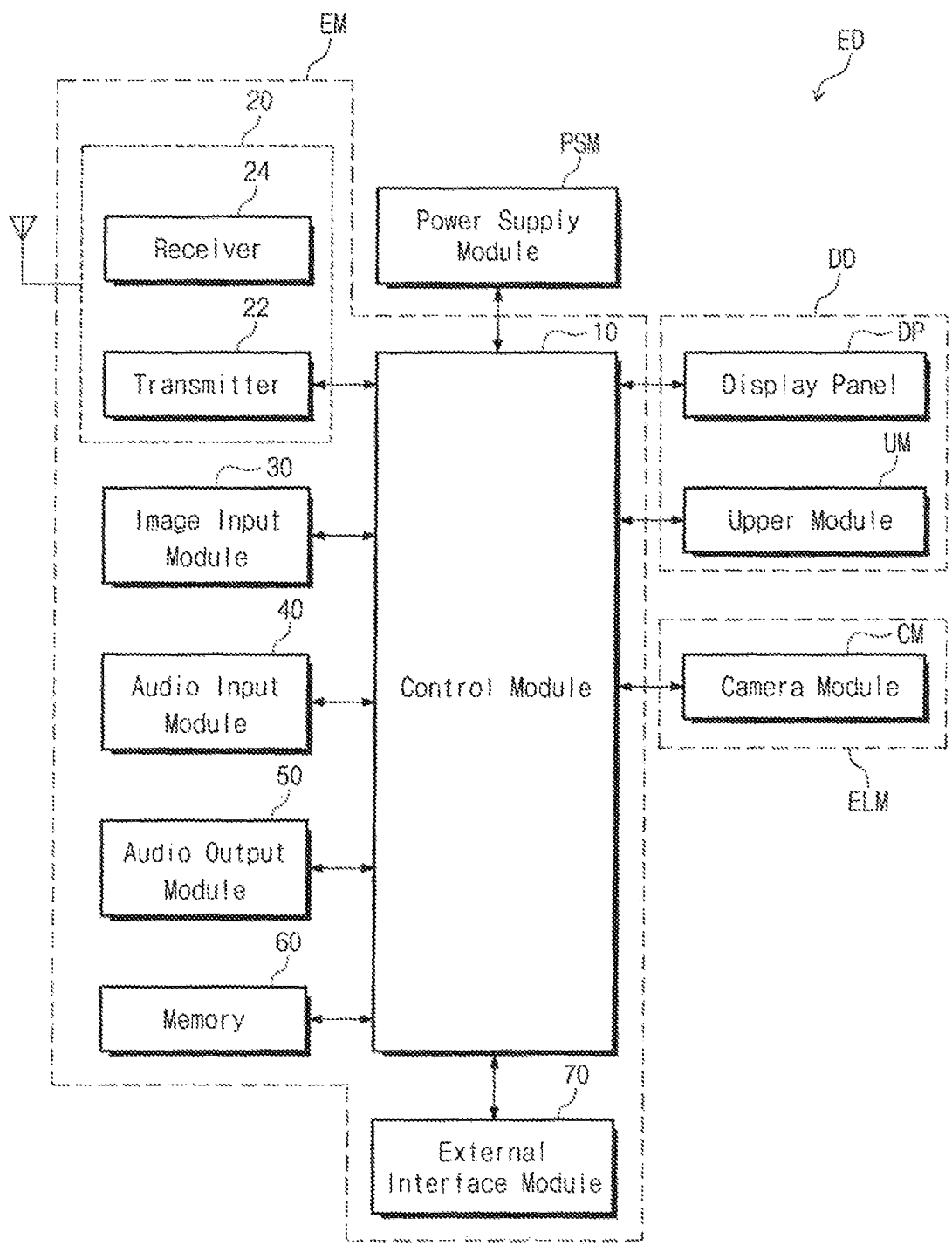
FIG. 3 is a block diagram of an electronic device according to an embodiment of the present disclosure.

FIG. 1 is a perspective view of an electronic device ED according to an embodiment of the present disclosure, and FIG. 2 is an exploded perspective view of the electronic device ED according to an embodiment of the present disclosure. FIG. 3 is a block diagram of the electronic device ED according to an embodiment of the present disclosure.

Referring to FIG. 1, in an embodiment, the electronic device ED displays an image IM through a display surface ED-IS. The display surface ED-IS is substantially parallel to a plane defined by a first direction DR1 and a second direction DR2, where the second direction DR2 crosses the first direction DR1. For example, the second direction DR2 is substantially perpendicular to the first direction DR1. A third direction DR3 is normal lto the display surface ED-IS, i.e., a thickness direction of the electronic device ED. The third direction DR3 is substantially perpendicular to the plane defined by the first direction DR1 and the second direction DR2. Hereinafter, in the present disclosure, the expression "when viewed in a plane" means being viewed from the third direction DR3. The display surface ED-IS of the electronic device ED corresponds to a front surface of the electronic device ED and an upper surface of a window WM (see FIG. 2).

Hereinafter, front (or upper) and rear (or lower) surfaces of each member are defined with respect to a direction in which the image IM is displayed, where the front (or upper) surface is the surface from which the image IM is displayed. The front and rear surfaces are opposite to each other in the third direction DR3, and a normal of each of the front and rear surfaces is substantially parallel to the third direction DR3.

A separation distance in the third direction DR3 between the front rear surfaces of the electronic device ED corresponds to the thickness in the third direction DR3 of the electronic device ED. However, the first, second, and third directions DR1, DR2, and DR3 are relative to each other and may be changed to other directions.

In an embodiment, the display surface ED-IS includes a display area DA and a non-display area NDA that is adjacent to the display area DA. The display area DA is an area through which the image IM is displayed. The user can view the image IM through the display area DA. In a present embodiment, the display area DA has a rectangular shape with rounded vertices, however, embodiments are not limited thereto. The display area DA may have a variety of shapes in other embodiments.

In an embodiment, the non-display area NDA is an area through which no image is displayed. The non-display area NDA includes a first non-display area BZA and a second non-display area TA. The first non-display area BZA is an area where an optical signal is blocked, is disposed outside the display area DA, and surrounds the display area DA.

According to an embodiment, the first non-display area BZA is disposed on at least one side surface of the electronic device ED rather than the front surface of the electronic device ED.

According to an embodiment, the first non-display area BZA is omitted.

In a present embodiment, the first non-display area BZA that surrounds the display area DA is shown as a representative example, however, embodiments are not limited thereto. In other embodiments, the first non-display area BZA may be disposed only at one side of the display area or may be disposed at opposite sides facing each other in either the first direction DR1 or the second direction DR2 of the display area DA.

In an embodiment, the second non-display area TA is an area that transmits or receives an optical signal. Although a single second non-display area TA is shown in FIG. 1 as a representative example, embodiments are not limited thereto, and two or more second non-display areas TA may be formed. In a present embodiment, the second non-display area TA is surrounded by the display area DA. In a present embodiment, the optical signal is external light (see FIG. 2) or infrared light generated by an electronic optical module ELM (see FIG. 2). Although FIG. 1 shows a structure in which the display area DA is located between the first and second non-display areas BZA and TA, however, embodiments of the present disclosure are not limited thereto. For example, in other embodiments, a portion of the second non-display area TA extends from the first non-display area BZA into the display area DA.

In a present embodiment, the display surface ED-IS is shown as being flat, however, according to an embodiment, curved areas may be formed at opposite sides of the display surface ED-IS that face each other in the second direction DR2 or the first direction DR1.

In a present embodiment, a mobile phone is shown as a representative example, however, the electronic device ED according to an embodiment of the present disclosure is not limited to a mobile phone and may be any of various other information providing devices, such as a television set, a navigation unit, a computer monitor, or a game unit, etc.

Referring to FIGS. 2 and 3, in an embodiment, the electronic device ED includes a display device DD, an electronic module EM, the electronic optical module ELM, a power supply module PSM, and a housing HM.

The display device DD generates the image IM. The display device DD includes a display panel DP, an upper module UM, and a window WM.

Embodiments of the display panel DP are not particularly limited. For example, the display panel DP may be a light emitting type display panel, such as an organic light emitting display panel, or a quantum dot light emitting display panel. A light emitting layer of an organic light emitting display panel includes an organic light emitting material. Hereinafter, for convenience of description, the display panel DP will be described in terms of a organic light emitting display panel.

In a present embodiment, the display panel DP includes an active area AA and a non-active area NAA. The active area AA is an area from which an image is displayed from the display panel DP. The non-active area NAA is adjacent to the active area AA. For example, the non-active area NAA surrounds the active area AA, however, embodiments are not limited thereto. The non-active area NAA can have a variety of other shapes in other embodiments. According to an embodiment, the active area AA of the display panel DP corresponds to at least a portion of the display area DA.

In a present embodiment, the display panel DP includes a plurality of pixels PX. The pixels PX are arranged in the active area AA. Each of the pixels PX includes a display element layer OLED (see FIG. 5) and a transistor TR (see FIG. 5) connected to the display element layer OLED.

In a present embodiment, the window WM provides an exterior surface of the display device DD. The window WM includes a transparent material that transmits the image IM.

For example, the window WM may include glass, sapphire, or a plastic. The window WM may have a single-layer structure, however, embodiments are not limited thereto, and the window WM may include a plurality of layers in other embodiments. The first non-display area BZA of the display device DD can be formed by printing a colored material on an area of the window WM. For example, the window WM includes a second light blocking pattern SHP_b (see FIG. 11) that forms the first non-display area BZA. The second light blocking pattern SHP_b is a colored organic layer and is formed by a coating method. The window WM includes a base substrate and furthers include functional layers, such as an anti-fingerprint layer.

According to embodiments, based on configurations of the upper module UM, the display device DD can sense an external input and/or an external pressure. The upper module UM includes a variety of members. In a present embodiment, the upper module UM includes an anti-reflective layer RPL (see FIG. 4) and an input sensor layer ISP (see FIG. 4). The upper module UM will be described in detail below with reference to FIG. 4.

According to embodiments, the electronic module EM includes a control module 10, a wireless communication module 20, an image input module 30, an audio input module 40, an audio output module 50, a memory 60, and an external interface module 70. The modules 10, 20, 30, 40, 50, 60, and 70 may be mounted on a circuit board or may be electrically connected to each other through a flexible circuit board. The electronic module EM is electrically connected to the power supply module PSM.

According to embodiments, the control module 10 controls an overall operation of the electronic device ED. For example, the control module 10 may activate or deactivate the display device DD in response to a user's input. The control module 10 controls other modules, such as the image input module 30, the audio input module 40, or the audio output module 50, etc., in response to the user's input. The control module 10 includes at least one microprocessor.

According to embodiments, the wireless communication module 20 transmits/receives wireless signals to/from other terminals using a Bluetooth or WiFi link. The wireless communication module 20 transmits/receives a voice signal using a general communication line. The wireless communication module 20 includes a transmitter 22 that modulates a signal to be transmitted and transmits the modulated signal and a receiver 24 that demodulates a received signal.

According to embodiments, the image input module 30 processes an image signal and converts the image signal into image data that can be displayed through the display device DD. The audio input module 40 receives an external sound signal through a microphone in a record mode or a voice recognition mode and converts the external sound signal to electrical voice data. The audio output module 50 converts sound data received from the wireless communication module 20 or sound data stored in the memory 60 and outputs the converted sound data.

According to embodiments, the external interface module 70 is an interface between the control module 10 and external devices, such as an external charger, a wired/wireless data port, or a card socket, such as a memory card or a SIM/UIM card, etc.

According to embodiments, the power supply module PSM supplies power required for the overall operation of the electronic device ED. The power supply module PSM may include a conventional battery device.

According to embodiments, the housing HM shown in FIG. 2 is coupled to the display device DD, particularly, the window WM, to accommodate other modules. FIG. 2 shows the housing HM as formed in a single unit as a representative example. However, embodiments are not limited thereto, and in other embodiments, the housing HM includes two or more components assembled to each other.

According to embodiments, the electronic optical module ELM is an electronic component that transmits or receives an optical signal. The electronic optical module ELM transmits or receives the optical signal through a portion of the electronic device ED that corresponds to the second non-display area TA. In a present embodiment, the electronic optical module ELM includes a camera module CM. The camera module CM receives external light NL through the second non-display area TA to take a photo of an external object. The electronic optical module ELM may further include a proximity sensor or an ultraviolet light sensor.

According to embodiments, the electronic optical module ELM is disposed under the display device DD. The electronic optical module ELM overlaps the second non-display area TA of the display device DD. The second non-display area TA of the display device DD has a light transmittance higher than that of other areas of the display device DD. Hereinafter, for convenience of explanation, the second non-display area TA is referred to as a first area, and the display area DA is referred to as a second area.

Figure 4:
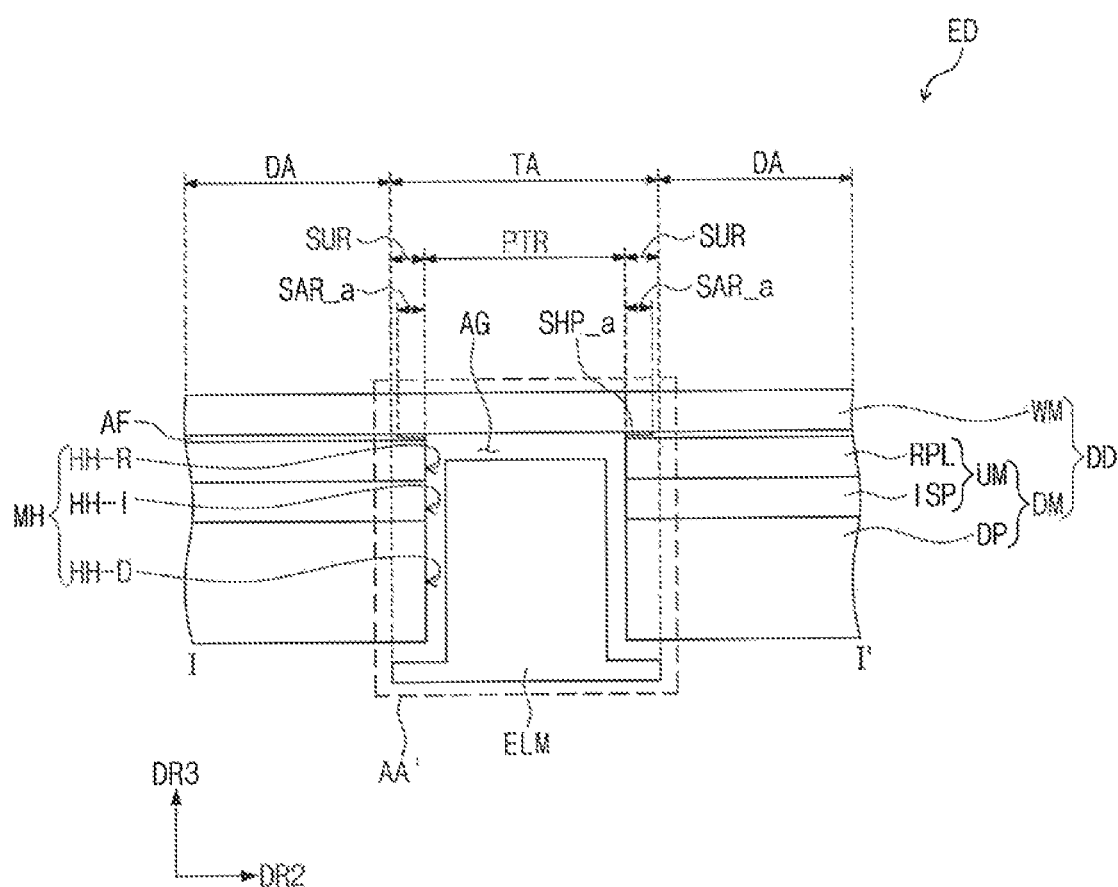
FIG. 4 is a cross-sectional view taken along a line I-I' in FIG. 2 of an electronic device according to an embodiment of the present disclosure.

FIG. 4 is a cross-sectional view taken along a line I-I' shown in FIG. 2 and shows the electronic device ED according to an embodiment of the present disclosure.

Referring to FIG. 4, according to embodiments, the electronic optical module ELM overlaps the first area TA. A display module DM is disposed under the window WM. The display module DM includes the upper module UM and the display panel DP. The window WM is disposed on the display module DM and covers a front surface of the display module DM and the electronic optical module ELM.

For example, according to embodiments, the display module DM is provided with a module hole MH formed therein. The module hole MH is formed through the anti-reflective layer RPL, the input sensor layer ISP, and the display panel DP.

According to embodiments, the first area TA includes a penetration area PTR and a peripheral area SUR. The penetration area PTR is an area that overlaps the module hole MH. The peripheral area SUR is the remaining area of the first area TA that excludes the penetration area PTR.

According to embodiments, the module hole MH includes a hole HH-R formed through the anti-reflective layer RPL, a hole HH-I formed through the input sensor layer ISP, and a hole HH-D formed through the display panel DP. In other words, the module hole MH penetrates through the display module DM. The hole HH-R formed through the anti-reflective layer RPL is referred to as a first hole HH-R, the hole HH-I formed through the input sensor layer ISP is referred to as a second hole HH-I, and a hole HH-D formed through the display panel DP is referred to as a third hole HH-D. The third hole HH-D may also be referred to as a panel hole. In an embodiment, the first, second, and third holes HH-R, HH-I, and HH-D are substantially aligned with each other. As the first, second, and third holes HH-R, HH-I, and HH-D are formed in the display module DM, a transmittance of the external light NL (see FIG. 2) to the electronic optical module ELM or infrared light emitted by the electronic optical module ELM can be improved.

According to embodiments, the module hole MH overlaps the electronic optical module ELM, and at least a portion of the electronic optical module ELM is inserted into the module hole MH. A gap AG is formed between the electronic optical module ELM in the module hole MH and the module hole MH. The gap AG may be filled with air, or with a transparent adhesive resin that prevents transmittance deterioration caused by diffuse reflection of the external light NL or the infrared light at an interface between the window WM and the gap AG.

According to embodiments, the electronic optical module ELM overlaps the first, second, and third holes HH-R, HH-I, and HH-D when inserted into the module hole MH. The electronic optical module ELM receives the external light NL or emits the infrared light, which both propagate through the window WM that overlaps the penetration area PTR.

According to embodiments, the module hole MH may have a variety of shapes depending on a shape of the electronic optical module ELM. In addition, when a position of the electronic optical module ELM changes, a position of the module hole MH and the penetration area PTR also change.

In an embodiment, the window WM includes a first light blocking pattern SHP_a. The location of the first light blocking pattern SHP_a corresponds to the peripheral area SUR of the first area TA. The first light blocking pattern SHP_a does not overlap the penetration area PTR. An area in which the first light blocking pattern SHP_a is disposed is referred to as a first light blocking area SAR_a. The first light blocking area SAR_a is included in the peripheral area SUR. The first light blocking pattern SHP_a does not overlap the module hole MH.

In an embodiment, the first light blocking pattern SHP_a has a closed-loop shape that surrounds an edge of the electronic optical module ELM when viewed in a plane, however, embodiments are not limited thereto. The shape of the first light blocking pattern SHP_a varies depending on the shape of the electronic optical module ELM and the position of the penetration area PTR. The first light blocking pattern SHP_a prevents the edge of the electronic optical module ELM from being perceived by a user.

In an embodiment, the first light blocking pattern SHP_a includes a light blocking material. For example, the light blocking material may be a black pigment or a dye. The first light blocking pattern SHP_a may be another color other than black. In addition, the light blocking material may be a light blocking metal.

In an embodiment, the display device DD further includes an adhesive layer AF. The adhesive layer AF is disposed between the window WM and the upper module UM. The window WM and the upper module UM are coupled to each other by the adhesive layer AF.

The adhesive layer AF includes an optically clear adhesive (OCA) film. However, embodiments are not limited thereto, and in other embodiments, the adhesive layer AF includes a conventional adhesive. For example, the adhesive layer AF may include an optically clear resin (OCR) or a pressure sensitive adhesive film (PSA).

In an embodiment, the upper module UM includes the anti-reflective layer RPL and the input sensor layer ISP. The anti-reflective layer RPL reduces a reflectance of external light NL incident thereto from above the window WM. The input sensor layer ISP senses an external input from a user. The upper module UM may further include an adhesive layer that attaches the anti-reflective layer RPL to the input sensor layer ISP.

In an embodiment, the anti-reflective layer RPL includes a retarder and a polarizer. The retarder may be a film type or a liquid crystal coating type and may include a 12 retarder and/or a λ/4 retarder. The polarizer may be also a film type or a liquid crystal coating type. The film type polarizer includes a stretching type synthetic resin film, and the liquid crystal coating type polarizer includes liquid crystals aligned in a predetermined alignment. The retarder and the polarizer are implemented as one polarizing film. The anti-reflective layer RPL may further include a protective film disposed above or under the polarizing film. However, embodiments of the present disclosure are not limited thereto, and in other embodiments, the anti-reflective layer RPL further includes a plurality of color filters and light blocking patterns disposed between the color filters.

In an embodiment, the input sensor layer ISP can sense an external input by a capacitance method, a pressure sensing method, or an electromagnetic induction method. The input sensor layer ISP is disposed directly on the display panel DP. According to an embodiment, the input sensor layer ISP is disposed directly on the display panel DP through successive processes. That is, when the input sensor layer ISP is disposed directly on the display panel DP, no inner adhesive film is disposed between the input sensor layer ISP and the display panel DP. However, in other embodiments, an inner adhesive film is disposed between the input sensor layer ISP and the display panel DP. In this case, the input sensor layer ISP is not manufactured together with the display panel DP through the successive processes. That is, the input sensor layer ISP is fixed to an upper surface of the display panel DP by the inner adhesive film after being separately manufactured from the display panel DP.

The first light blocking pattern SHP_a included in the window WM is shown as a representative example. However, embodiments are not limited thereto, and the light blocking pattern provided around the module hole MH may be disposed between the adhesive layer AF and the anti-reflective layer RPL or between the anti-reflective layer RPL and the input sensor layer ISP.

Figure 5:
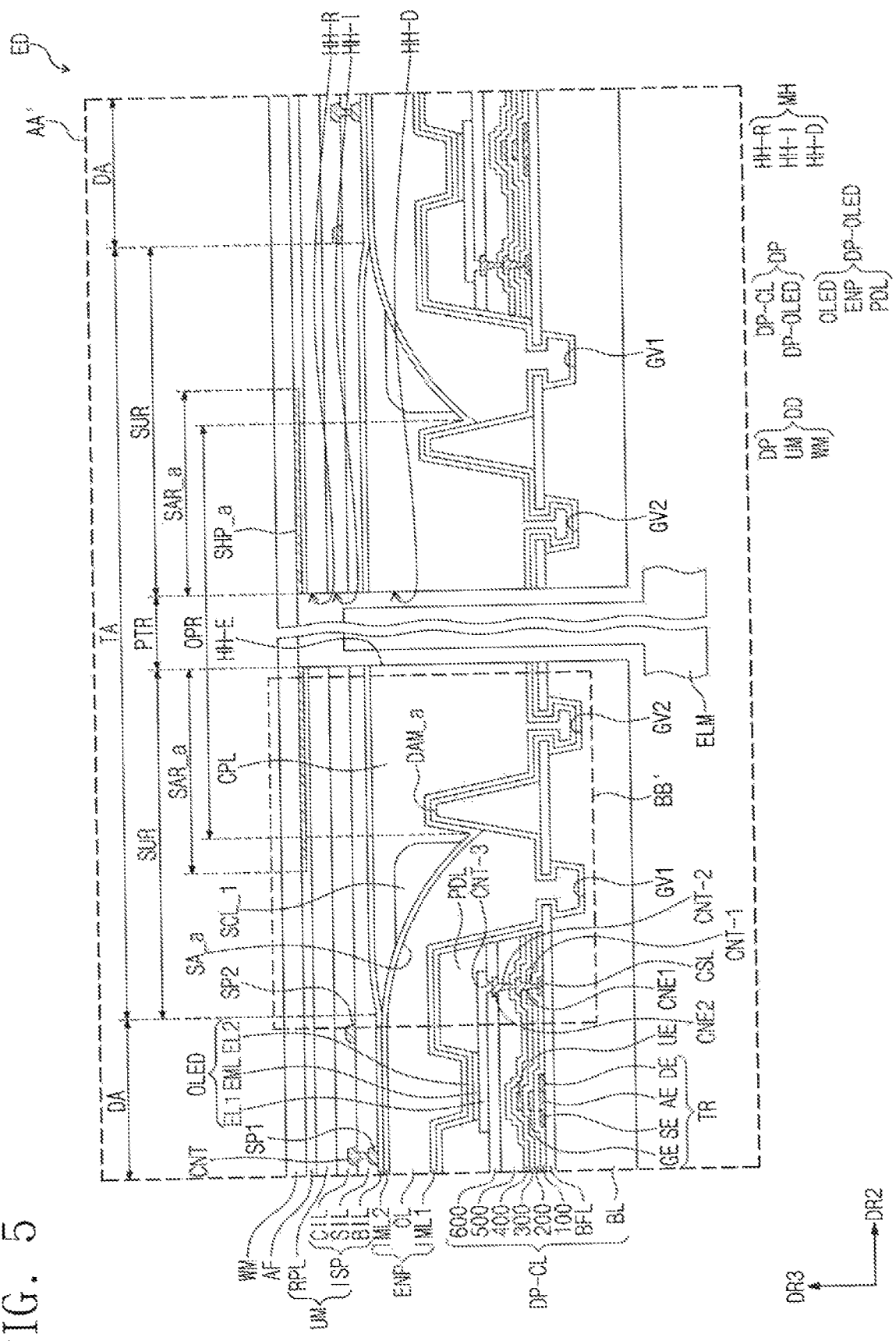
FIG. 5 is an enlarged cross-sectional view of a portion of an electronic device that corresponds to a portion AA' of FIG. 4 according to an embodiment of the present disclosure.

FIG. 5 is an enlarged cross-sectional view of a portion of the electronic device ED that corresponds to a portion AN of FIG. 4 according to an embodiment of the present disclosure. In FIG. 5, the same reference numerals denote the same elements in FIGS. 2 to 4, and thus, detailed descriptions of the same elements will be omitted.

FIG. 5 shows the display device DD of the electronic device ED. In an embodiment, the display device DD includes the display panel DP, the upper module UM, and the window WM. The display panel DP includes a circuit element layer DP-CL and a pixel layer DP-OLED.

In an embodiment, the display panel DP includes a plurality of intermediate insulating layers, a semiconductor pattern, a conductive pattern, and a signal line. An intermediate insulating layer, a semiconductor layer, and a conductive layer are formed by a coating or depositing process. Then, the intermediate insulating layer, the semiconductor layer, and the conductive layer are selectively patterned by a photolithography process. In this way, the semiconductor pattern, the conductive pattern, and the signal line in the display panel DP and the upper module UM can be formed.

In an embodiment, the circuit element layer DP-CL includes a base layer BL, a buffer layer BFL, a first intermediate insulating layer 100, a second intermediate insulating layer 200, a third intermediate insulating layer 300, a fourth intermediate insulating layer 400, a fifth intermediate insulating layer 500, and a sixth intermediate insulating layer 600.

In an embodiment, the base layer BL includes a synthetic resin film. The synthetic resin film includes a heat-curable resin. The base layer BL has a multi-layer structure. For instance, the base layer BL has a three-layer structure of a synthetic resin layer, an adhesive layer, and a synthetic resin layer. In particular, the synthetic resin layer is a polyimide-based resin layer, however, embodiments are not limited thereto. In other embodiments, the synthetic resin layer includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer BL may include a glass substrate, a metal substrate, or an organic/inorganic composite substrate.

In an embodiment, the base layer BL includes a plurality of grooves GV1 and GV2 formed therein. The grooves GV1 and GV2 are formed in the first area TA. FIG. 5 shows a structure in which the grooves include a first groove GV1 and a second groove GV2, however, embodiments are not limited to the number of the grooves shown in the figure. According to an embodiment, each of the first and second grooves GV1 and GV2 surrounds the module hole MH when viewed in a plane.

In an embodiment, each of the first and second grooves GV1 and GV2 has a shape recessed from an upper surface of the base layer BL. The first and second grooves GV1 and GV2 have a depth that does not penetrate the base layer BL. The first and second grooves GV1 and GV2 block a path through which external moisture or oxygen infiltrates and prevent elements disposed in the display area DA from being damaged.

In an embodiment, at least one inorganic layer is formed on an upper surface of the base layer BL. The inorganic layer includes at least one of aluminum oxide, titanium oxide, silicon oxide, silicon oxynitride, zirconium oxide, or hafnium oxide. The inorganic layer is formed in multiple layers. The inorganic layers form a barrier layer and/or a buffer layer. In a present embodiment, the circuit element layer DP-CL includes the buffer layer BFL.

In an embodiment, the buffer layer BFL increases an adhesion between the base layer BL and the semiconductor pattern. The buffer layer BFL includes a silicon oxide layer and a silicon nitride layer, and the silicon oxide layer and the silicon nitride layer are alternately stacked with each other.

In an embodiment, the semiconductor pattern is disposed on the buffer layer BFL. The semiconductor pattern includes polysilicon, however, embodiments are not limited thereto. For example, in other embodiments, the semiconductor pattern may include amorphous silicon or a metal oxide.

FIG. 5 shows only a portion of the semiconductor pattern, and the semiconductor pattern is further disposed in other areas of the pixel in a plane. In an embodiment, the semiconductor pattern is arranged with a specific rule over the pixels PX. The semiconductor pattern has different electrical properties depending on whether or not it is doped and whether it is doped with an N-type dopant or a P-type dopant. The semiconductor pattern includes a first semiconductor region that has a relatively high conductance and a second semiconductor region that has a relatively low conductance. The first semiconductor region may be doped with the N-type dopant or the P-type dopant. A P-type transistor includes a doped region doped with the P-type dopant. The second semiconductor region may be a non-doped region or may be doped at a concentration lower than that of the first semiconductor region.

In an embodiment, the first semiconductor region has a conductivity greater than that of the second semiconductor region and serves as an electrode or signal line. The second semiconductor region corresponds to an active region (or a channel) of a transistor. In other words, a portion of the semiconductor pattern is the active region of the transistor, another portion of the semiconductor pattern is a source region or a drain region of the transistor, and the other portion of the semiconductor pattern is a connection electrode or a connection signal line.

As shown in FIG. 5, in an embodiment, a source region SE, an active region AE, and a drain region DE of the transistor TR are formed from the semiconductor pattern. The source region SE and the drain region DE extend in opposite directions to each other from the active region AE. FIG. 5 shows a portion of a connection signal line CSL formed from the semiconductor pattern. The connection signal line CSL is electrically connected to the drain DE of the transistor TR.

In an embodiment, the first intermediate insulating layer 100 is disposed on the buffer layer BFL. The first intermediate insulating layer 100 commonly overlaps the pixels PX and covers the semiconductor pattern. The first intermediate insulating layer 100 may be an inorganic layer and/or an organic layer and may have a single-layer or multi-layer structure. The first intermediate insulating layer 100 includes at least one of aluminum oxide, titanium oxide, silicon oxide, silicon oxynitride, zirconium oxide, or hafnium oxide. In a present embodiment, the first intermediate insulating layer 100 has a single-layer structure of a silicon oxide layer. In addition to the first intermediate insulating layer 100, an intermediate insulating layer of the circuit element layer DP-CL described below is an inorganic layer and/or an organic layer and may have a single-layer or multi-layer structure. The inorganic layer includes at least one of the above-mentioned materials.

In an embodiment, a gate GE is disposed on the first intermediate insulating layer 100. The gate GE corresponds to a portion of a metal pattern. The gate GE overlaps the active region AE. The gate GE is used as a mask in a process of doping the semiconductor pattern.

In an embodiment, the second intermediate insulating layer 200 is disposed on the first intermediate insulating layer 100 and covers the gate GE. The second intermediate insulating layer 200 commonly overlaps the pixels. The second intermediate insulating layer 200 may be an inorganic layer and/or an organic layer and may have a single-layer or multi-layer structure. In a present embodiment, the second intermediate insulating layer 200 has a single-layer structure of a silicon oxide layer.

In an embodiment, an upper electrode UE is disposed on the second intermediate insulating layer 200. The upper electrode UE is a portion of a metal pattern. A portion of the gate GE and the upper electrode UE that overlaps the portion of the gate GE form a capacitor. According to an embodiment, the upper electrode UE is omitted.

In an embodiment, the third intermediate insulating layer 300 is disposed on the second intermediate insulating layer 200 and covers the upper electrode UE. The third intermediate insulating layer 300 commonly overlaps the pixels. The third intermediate insulating layer 300 may be an inorganic layer and/or an organic layer and may have a single-layer or multi-layer structure. In a present embodiment, the third intermediate insulating layer 300 has a single-layer structure of a silicon oxide layer.

In an embodiment, a first connection electrode CNE1 is disposed on the third intermediate insulating layer 300. The first connection electrode CNE1 is connected to the connection signal line CSL via a first contact hole CNT-1 formed through the first, second, and third intermediate insulating layers 100, 200, and 300.

In an embodiment, the fourth intermediate insulating layer 400 is disposed on the third intermediate insulating layer 300. The fourth intermediate insulating layer 400 has a single-layer structure of a silicon oxide layer.

In an embodiment, the fifth intermediate insulating layer 500 is disposed on the fourth intermediate insulating layer 400. The fifth intermediate insulating layer 500 is an organic layer. A second connection electrode CNE2 is disposed on the fifth intermediate insulating layer 500. The second connection electrode CNE2 is connected to the first connection electrode CNE1 via a second contact hole CNT-2 formed through the fourth and fifth intermediate insulating layers 400 and 500.

In an embodiment, the sixth intermediate insulating layer 600 is disposed on the fifth intermediate insulating layer 500 and covers the second connection electrode CNE2. The sixth intermediate insulating layer 600 is an organic layer.

In an embodiment, the pixel layer DP-OLED is disposed on the circuit element layer DP-CL. The pixel layer DP-OLED includes the display element layer OLED, a pixel definition layer PDL, and an encapsulation layer ENP.

In an embodiment, the display element layer OLED includes a first electrode EL1 disposed on the circuit element layer DP-CL, a light emitting layer EML disposed on the first electrode EL1, and a second electrode EL2 disposed on the light emitting layer EML.

In an embodiment, the first electrode EL1 is disposed on the sixth intermediate insulating layer 600. The first electrode EL1 is connected to the second connection electrode CNE2 via a third contact hole CNT-3 formed through the sixth intermediate insulating layer 600. The pixel definition layer PDL is disposed on the sixth intermediate insulating layer 600 and covers a portion of the first electrode EL1. A pixel opening is formed through the pixel definition layer PDL. At least a portion of the first electrode EL1 is exposed through the pixel opening of the pixel definition layer PDL.

In an embodiment, the light emitting layer EML is disposed on the first electrode EL1. The location of the light emitting layer EML corresponds to the pixel opening. That is, the light emitting layer EML is formed in each of the pixels PX (see FIG. 2) after being divided into a plurality of portions. The light emitting layer EML includes a light emitting material that includes a fluorescent material or a phosphorescent material. The light emitting material includes an organic light emitting material or an inorganic light emitting material, however, embodiments are not limited thereto.

In an embodiment, the second electrode EL2 is disposed on the light emitting layer EML and the pixel definition layer PDL. The second electrode EL2 has an integral shape and is commonly disposed over the pixels PX.

In an embodiment, the display element layer OLED further includes a hole control layer and an electron control layer. The hole control layer is disposed between the first electrode EL1 and the light emitting layer EML and further includes a hole injection layer. The electron control layer is disposed between the light emitting layer EML and the second electrode EL2 and further includes an electron injection layer.

In an embodiment, the encapsulation layer ENP is disposed on the second electrode EL2. The encapsulation layer ENP is commonly disposed over the pixels PX. In a present embodiment, the encapsulation layer ENP directly covers the second electrode EL2.

According to an embodiment, a capping layer is further disposed between the encapsulation layer ENP and the second electrode EL2 and covers the second electrode EL2. In this case, the encapsulation layer ENP directly covers the capping layer.

In an embodiment, the encapsulation layer ENP includes an opening portion OPR that corresponds to the first area TA. The opening portion OPR is included in the first area TA. The penetration area PTR is in the opening portion OPR.

In an embodiment, the encapsulation layer ENP includes a first inorganic layer IML1, an organic layer OL, and a second inorganic layer IML2. The first inorganic layer IML1 and the second inorganic layer IML2 protect the display element layer OLED from moisture and oxygen, and the organic layer OL protects the display element layer OLED from foreign substances such as dust particles. The first inorganic layer IML1 and the second inorganic layer IML2 each include at least one of a silicon nitride layer, a silicon oxynitride layer, a silicon oxide layer, a titanium oxide layer, or an aluminum oxide layer, etc. The organic layer OL includes an acrylic-based organic layer, however, embodiments are not limited thereto.

In an embodiment, the display panel DP further includes a first dam layer DAM_a disposed on the base layer BL in the first area TA. The first dam layer DAM_a is referred to as a protruding portion. The first dam layer DAM_a is disposed between the first groove GV1 and the second groove GV2. The first dam layer DAM_a may have a stack structure of a plurality of insulating layers or may have a single-layer structure. The first dam layer DAM_a defines an area in which the organic layer OL is disposed.

In an embodiment, the first inorganic layer IML1 is disposed on the display element layer OLED. The organic layer OL is disposed on the first inorganic layer IML1. The first dam layer DAM_a prevents the organic layer OL from flowing into the penetration area PTR when the organic layer OL is deposited. The organic layer OL includes a first inclined portion SA_a that overlaps the first area TA and defines the opening portion OPR in the first area TA. The first inclined portion SA_a overlaps a portion of the first light blocking area SAR_a, however, embodiments are not limited thereto. According to embodiments, the first inclined portion SA_a might not overlap the first light blocking area SAR_a or may be included in the first light blocking area SAR_a.

In an embodiment, the organic layer OL is not deposited in the opening portion OPR and is encapsulated by the first dam layer DAM_a and the first and second inorganic layers IML1 and IML2 disposed on the first dam layer DAM_a. Accordingly, external moisture and oxygen can be prevented from entering the display element layer OLED via the penetration area PTR, and thus, damage to the display element layer OLED can be prevented.

In an embodiment, a height of the first inclined portion SA_a with respect to the base layer BL decreases with decreasing distance from the opening portion OPR. However, the first and second inorganic layers IML1 and IML2 have uniform thicknesses.

In an embodiment, the second inorganic layer IM2 is disposed on the organic layer OL. The third hole HH-D is formed through the base layer BL, the first intermediate insulating layer 100, and the first and second inorganic layers IML1 and IML2.

In an embodiment, the display panel DP further includes a first inclination compensation layer SCL_1. The first inclination compensation layer SCL_1 is disposed on the first inclined portion SA_a in the first area TA and does not overlap the opening portion OPR. The first inclination compensation layer SCL_1 overlaps a portion of the first light blocking area SAR_a, however, embodiments of the present disclosure are not limited thereto.

According to embodiments, the first inclination compensation layer SCL_1 might not overlap the first light blocking area SAR_a or may overlap the first light blocking area SAR_a.

In an embodiment, the first inclination compensation layer SCL_1 is disposed on the second inorganic layer IM2. The first inclination compensation layer SCL_1 does not overlap the first dam layer DAM_a. As the height of the first inclined portion SA_a decreases, a thickness of the first inclination compensation layer SCL_1 disposed on the first inclined portion SA_a increases. Accordingly, a step difference or an inclination of the first inclined portion SA_a is compensated for by the first inclination compensation layer SCL_1.

In an embodiment, the input sensor layer CSP is disposed on the encapsulation layer ENP and includes a base insulating layer BIL, a first conductive layer, a sensing insulating layer SIL, a second conductive layer, and a cover insulating layer CIL.

In an embodiment, the base insulating layer BIL is disposed directly on the display panel DP. For example, the base insulating layer BIL is directly in contact with the second inorganic layer IML2. The base insulating layer BIL may have a single-layer or a multi-layer structure.

In an embodiment, each of the first conductive layer and the second conductive layer may have a single-layer structure or a multi-layer structure of layers stacked in the third direction DR3. A single-layer conductive layer includes one of a metal layer or a transparent conductive layer.

In an embodiment, the first conductive layer and the second conductive layer include a first sensing pattern SP1, a connection pattern CNT, a second sensing pattern SP2, etc. The input sensor layer ISP senses an external input applied thereto from the outside through the first and second sensing patterns SP1 and SP2 and the connection pattern CNT that connects the first sensing patterns SP1. The input sensor layer ISP further includes a connection pattern that connects the second sensing patterns SP2.

In an embodiment, the anti-reflective layer RPL is disposed on the input sensor layer ISP. The adhesive layer AF is disposed on the anti-reflective layer RPL.

In an embodiment, the window WM includes the first light blocking pattern SHP_a.

The first light blocking pattern SHP_a is disposed in the first area TA. The first light blocking pattern SHP_a overlaps a portion of the first inclined portion SA_a and the opening portion OPR. The first light blocking pattern SHP_a does not overlap the penetration area PTR. According to an embodiment, the first light blocking pattern SHP_a overlaps the opening portion OPR but not the first inclined portion SA_a and the penetration area PTR. In addition, the first light blocking pattern SHP_a overlaps the first inclined portion SA_a and at least a portion of the opening portion OPR but not the penetration area PTR. The first light blocking area SAR_a blocks external light NL (see FIG. 5) incident into the electronic device ED. In addition, when external light NL is reflected in the electronic device ED into the first light blocking area SAR_a, the external light NL is blocked.

In an embodiment, the anti-reflective layer RPL prevents external light NL incident into the electronic device ED and reflected by electrodes in the circuit element layer DP-CL and the pixel layer DP-OLED from being perceived by a user.

When the encapsulation layer ENP includes the first inclined portion SA_a, a sensor layer inclined portion that corresponds to the first inclined portion SA_a may be formed in the input sensor layer ISP. Accordingly, a separation phenomenon in which the anti-reflective layer RPL disposed on the input sensor layer ISP separates from the sensor layer inclined portion of the input sensor layer ISP may occur, and thus, an empty space may be formed. In addition, when the input sensor layer ISP is omitted and the anti-reflective layer RPL is disposed directly on the encapsulation layer ENP, an empty space may be formed between the anti-reflective layer RPL and the first inclined portion SA_a.

When an empty space is formed, reflected external light NL may be additionally refracted or diffracted due to differences in refractive indices between the encapsulation layer ENP or the input sensor layer ISP and air in the empty space. Due to these optical phenomena, external light NL may exit from the anti-reflective layer RPL without being blocked by the anti-reflective layer RPL. In particular, in a structure in which the first light blocking pattern SHP_a does not completely overlap the first inclined portion SA_a, external light NL exiting through the anti-reflective layer RPL without being blocked by the first light blocking pattern SHP_a may be perceived by a user.

For example, in an embodiment in which the first inclination compensation layer SCL_1 is disposed on the first inclined portion SA_a, the separation phenomenon can be prevented from occurring. The first inclination compensation layer SCL_1 may include an organic layer or an inorganic layer. The first inclination compensation layer SCL_1 may include a material with a low reflectance such that the external light NL is not reflected by the first inclination compensation layer SCL_1 or is reflected in a low rate.

In an embodiment, the first inclination compensation layer SCL_1 is formed by patterning a photoresist using a half-tone mask or a multi-slit mask that has a slit, and thus, the first inclination compensation layer SCL_1 is formed to have a thickness that varies depending on a height variation of the first inclined portion SA_a. For example, as the height of the first inclined portion SA_a decreases, the thickness of the first inclination compensation layer SCL_1 on the first inclined portion SA_a increases, and thus, the separation phenomenon can be prevented. Accordingly, external light NL reflected in the electronic device ED is blocked by the anti-reflective layer RPL in an area of the peripheral area SUR other than the first light blocking area SAR_a.

In an embodiment, the display panel DP further includes a planarization layer CPL.

The planarization layer CPL is disposed on the encapsulation layer ENP and the first inclination compensation layer SCL_1 in the first area TA, and is covered by the base insulating layer BIL of the input sensor layer ISP. The planarization layer CPL surrounds the third hole HH-D. The planarization layer CPL includes an organic material. The planarization layer CPL covers an uneven surface caused by the first dam layer DAM_a or the second groove GV2 and provides a planar upper surface. Although the encapsulation layer ENP includes the first inclined portion SA_a, the step difference is compensated for by the first inclination compensation layer SCL_1. Accordingly, when the planarization layer CPL is disposed above the first inclination compensation layer SCL_1, the upper surface of the planarization layer CPL is planar when compared with the structure on which the planarization layer CPL is directly disposed, namely the first inclined portion SA_a.

FIGS. 6A to 6D are enlarged cross-sectional views of a portion of a display device corresponding to a portion BB' of FIG. 5 according to an embodiment of the present disclosure. In FIGS. 6A to 6D, the same reference numerals denote the same elements in FIGS. 2 to 5, and thus, detailed descriptions of the same elements will be omitted.

Figure 6A:
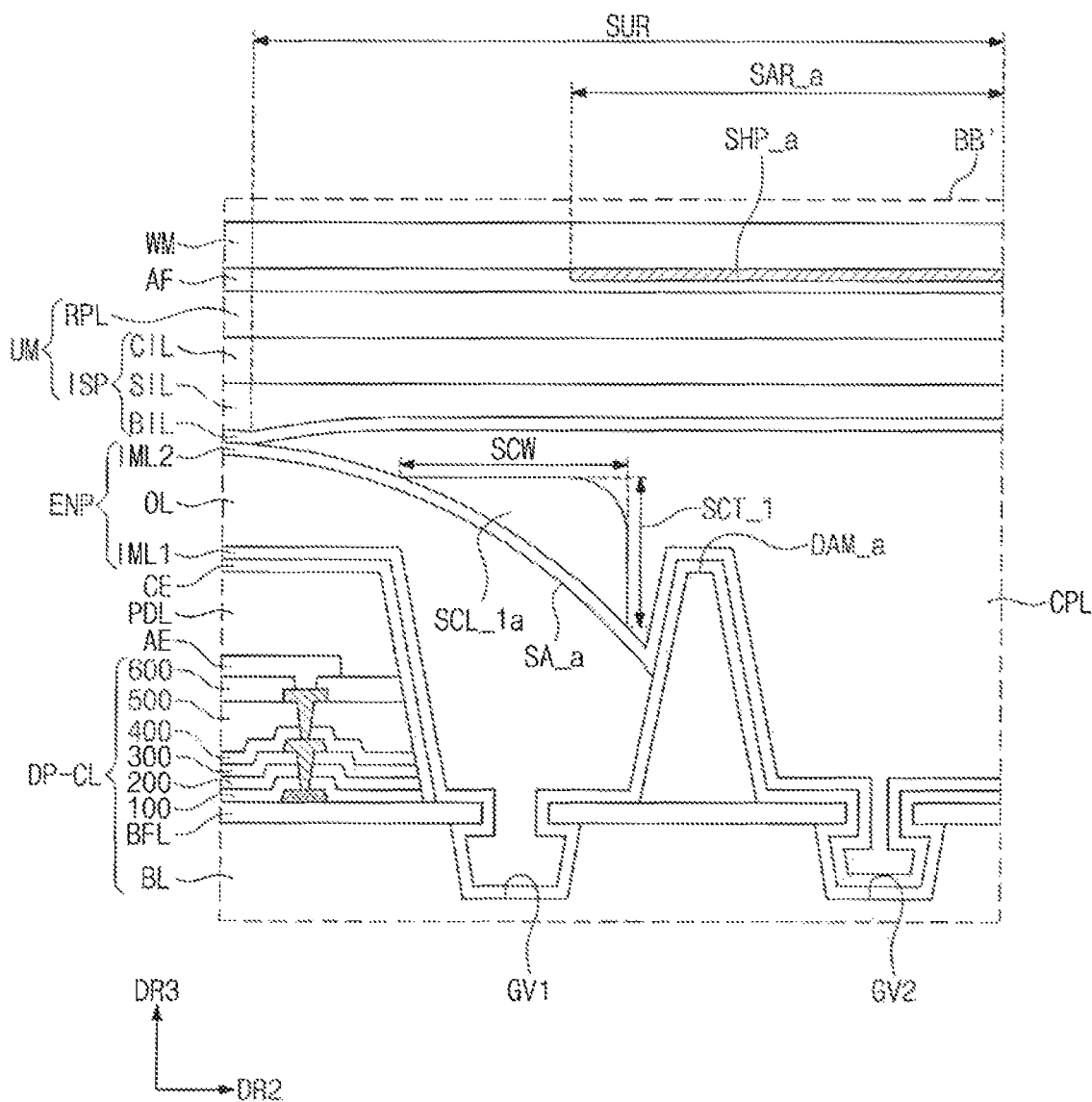
FIGS. 6A to 6D are enlarged cross-sectional views of a portion of a display device that corresponds to a portion BB' of FIG. 5 according to an embodiment of the present disclosure.

Referring to FIG. 6A, in an embodiment, a first inclination compensation layer SCL_1a is formed by depositing an organic layer or an inorganic layer on a first inclined portion SA_a and patterning the organic or inorganic layer using a deposition mask formed by patterning a photoresist. For example, the deposition mask is patterned such that the thickness of the first inclination compensation portion SCL_1a formed on the first inclined portion SA_a increases as the height of the first inclined portion SA_a decreases. The deposition mask is formed by patterning the photoresist using a halftone mask or a multi-slit mask to adjust the thickness of the first inclination compensation layer SCL_1a.

In an embodiment, a width SCW in the second direction DR2 of the first inclination compensation layer SCL_1a is within a range from tens to hundreds of micrometers (μm). Letting a thickness SCT1 in the third direction DR3 of the first inclination compensation layer SCL_1a be referred to as a first thickness SCT1, the first thickness SCT1 is within a range from a few to tens of micrometers (μm). In detail, the first inclination compensation layer SCL_1a has the width SCW from about 50 to about 500 micrometers (μm) and the first thickness SCT1 from about 1 to 4 micrometers (μm).

Figure 6B:
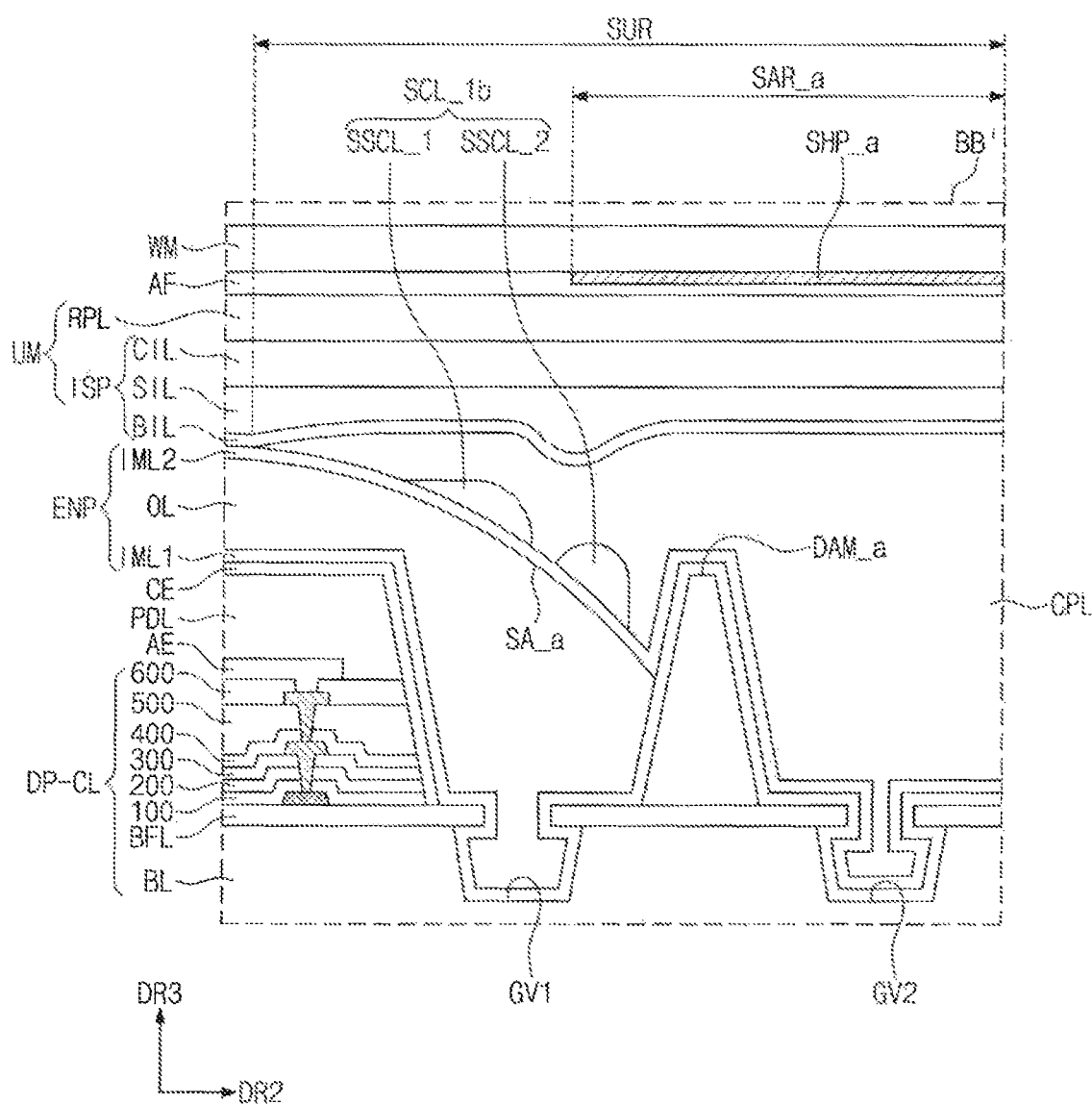

Referring to FIG. 6B, in an embodiment, a first inclination compensation layer SCL_1b includes a plurality of sub-inclination compensation layers. For example, the first inclination compensation layer SCL_1b includes a first sub-inclination compensation layer SSCL_1 and a second sub-inclination compensation layer SSCL_2. As a height of a first inclined portion SA_a decreases, a deposition mask is patterned such that a thickness of the first and second sub-inclination compensation layers SSCL_1 and SSCL_2 formed on the first inclined portion SA_a increases. The first and second sub-inclination compensation layers SSCL_1 and SSCL_2 include the same material. The first and second sub-inclination compensation layers SSCL_1 and SSCL_2 are formed using one deposition mask.

Figure 6C:
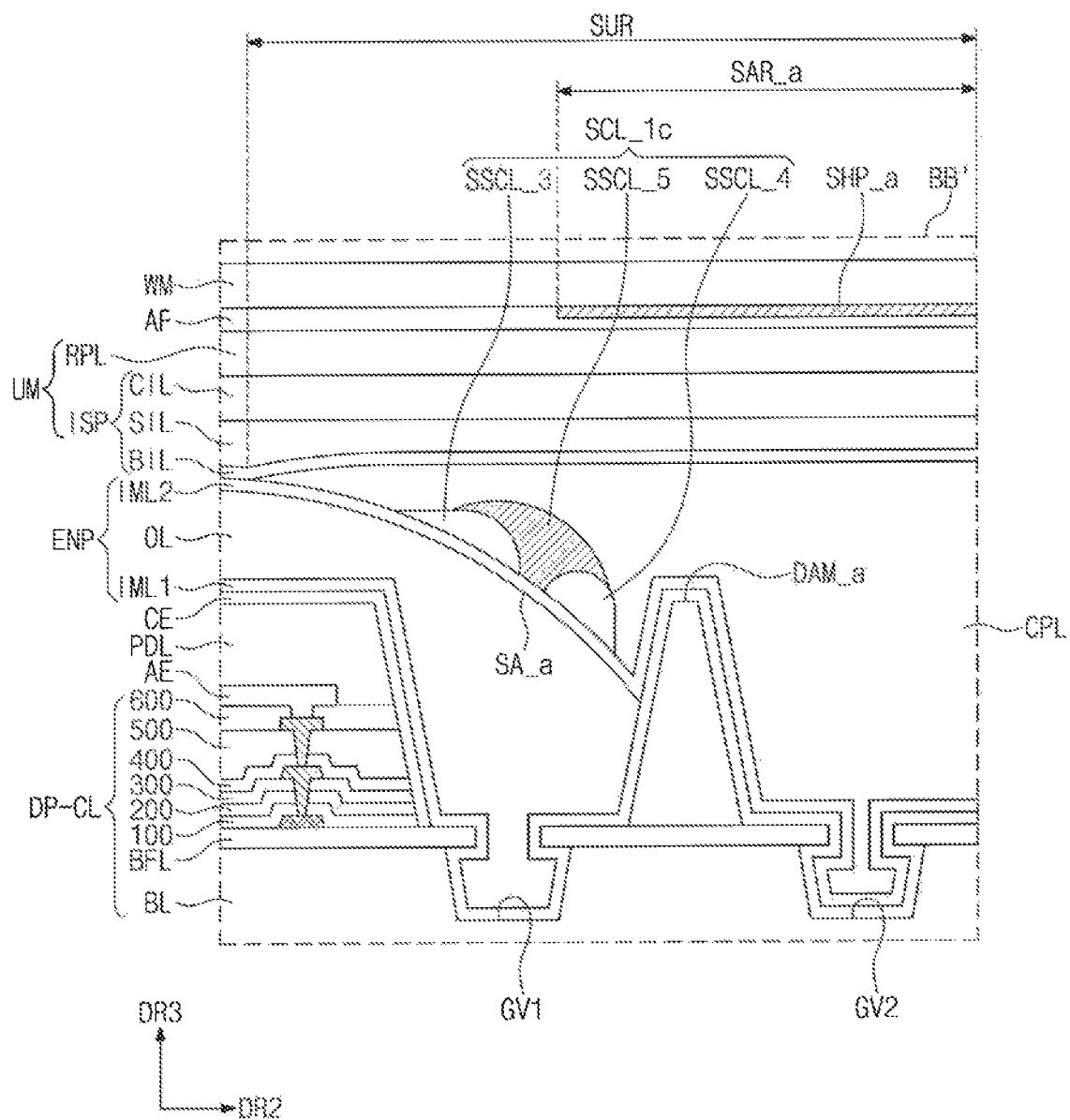

Referring to FIG. 6C, in an embodiment, a first inclination compensation layer SCL_1c includes a third sub-inclination compensation layer SSCL_3, a fourth sub-inclination compensation layer SSCL_4, and a fifth sub-inclination compensation layer SSCL_5. The third and fourth sub-inclination compensation layers SSCL_3 and SSCL_4 are formed using a first deposition mask, and the fifth sub-inclination compensation layer SSCL_5 is formed using a second deposition mask that differs from the first deposition mask. The fifth sub-inclination compensation layer SSCL_5 overlaps the third and fourth sub-inclination compensation layers SSCL_3 and SSCL_4 and fills a gap between the third and fourth sub-inclination compensation layers SSCL_3 and SSCL_4. The third, fourth, and fifth sub-inclination compensation layers SSCL_3, SSCL_4, and SSCL_5 include the same material as each other. However, embodiments are not limited thereto, and according to an embodiment, the material included in the fifth sub-inclination compensation layer SSCL_5 is different from the material included in the third and fourth sub-inclination compensation layers SSCL_3 and SSCL_4.

Figure 6D:
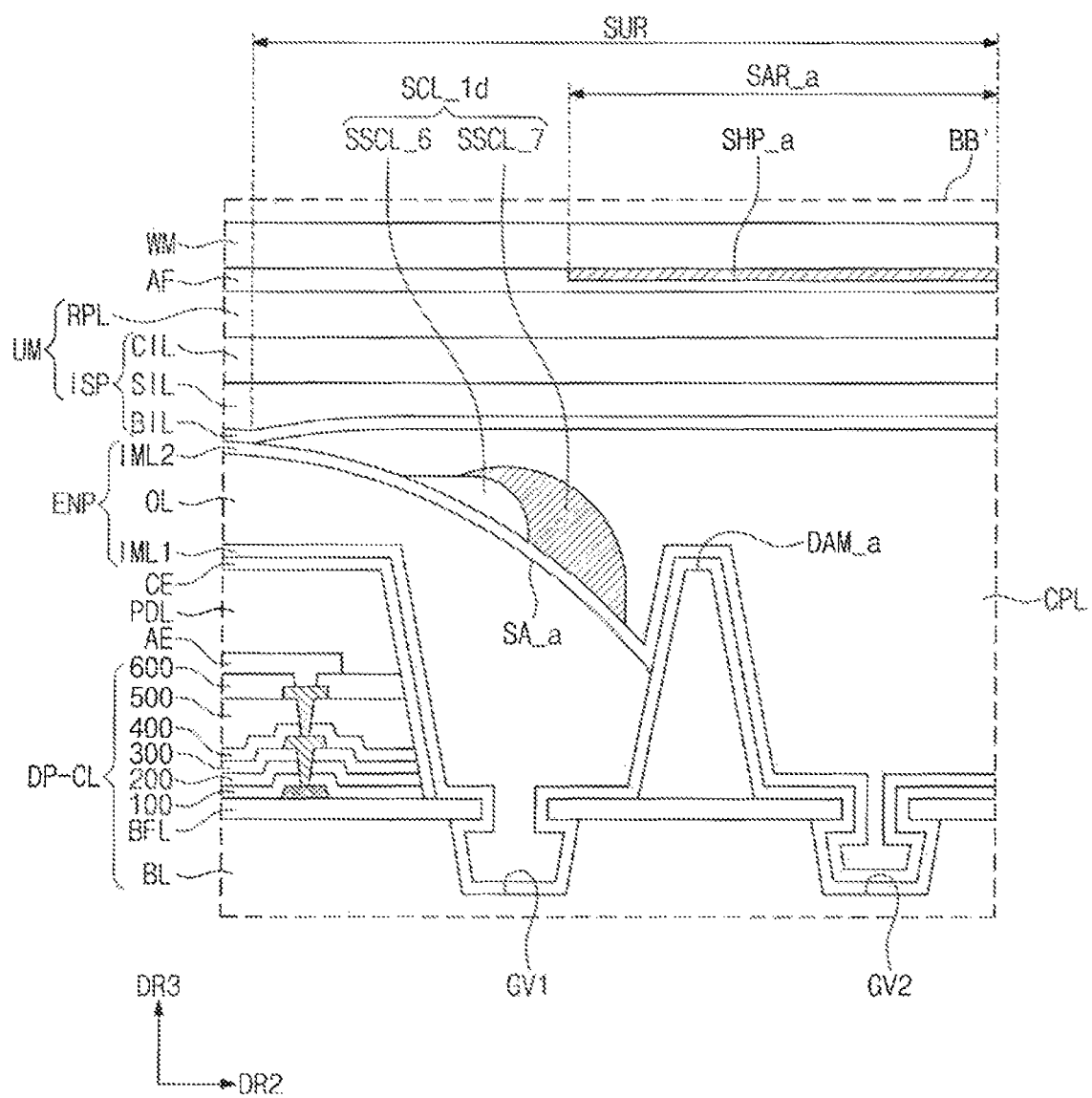

Referring to FIG. 6D, in an embodiment, a first inclination compensation layer SCL_1d includes a sixth sub-inclination compensation layer SSCL_6 and a seventh sub-inclination compensation layer SSCL_7. The sixth sub-inclination compensation layer SSCL_6 and the seventh sub-inclination compensation layer SSCL_7 are formed using different deposition masks. The seventh sub-inclination compensation layer SSCL_7 overlaps the sixth sub-inclination compensation layer SSCL_6. The sixth and seventh sub-inclination compensation layers SSCL_6 and SSCL_7 include the same material as each other. However, embodiments are not limited thereto, and according to an embodiment, the sixth sub-inclination compensation layer SSCL_6 includes a material that differs from the material included in the seventh sub-inclination compensation layer SSCL_7.

Figure 7:
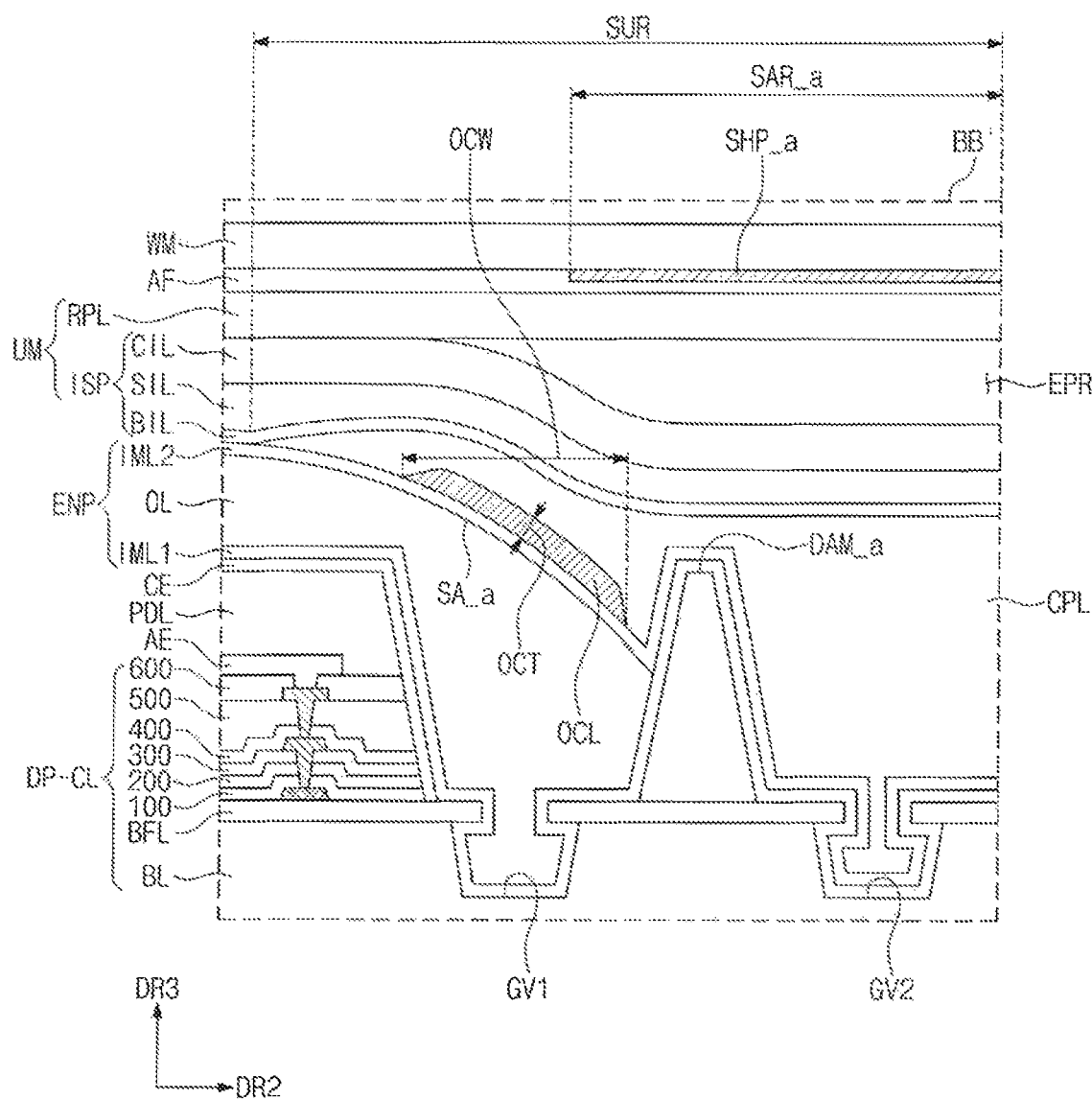
FIG. 7 is an enlarged cross-sectional view of a portion of a display device according to an embodiment of the present disclosure.
Figure 8:
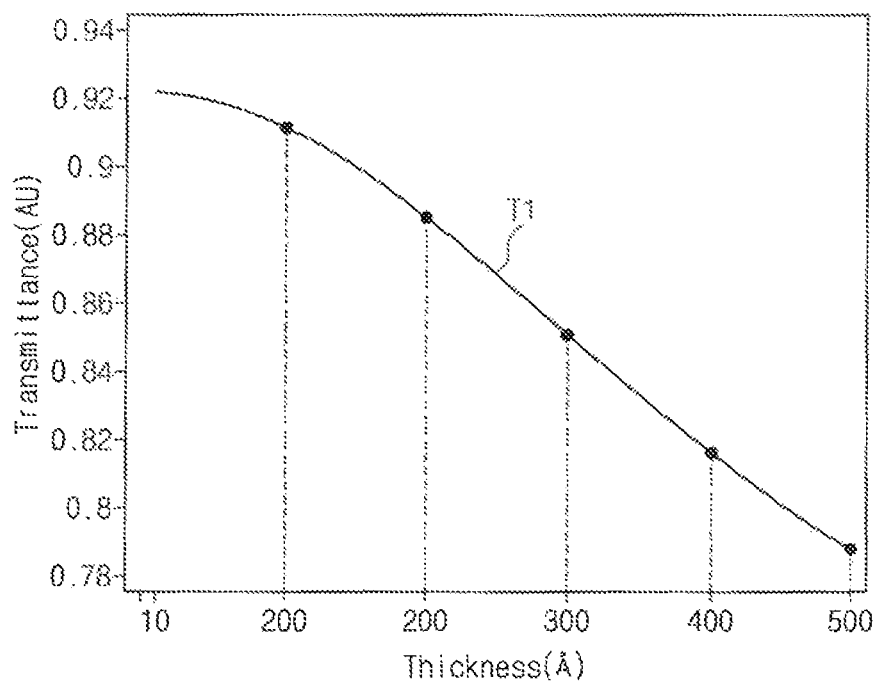
FIG. 8 is a graph of light transmittance as a function of a thickness variation of a transparent conductive material according to an embodiment of the present disclosure.
Figure 9:
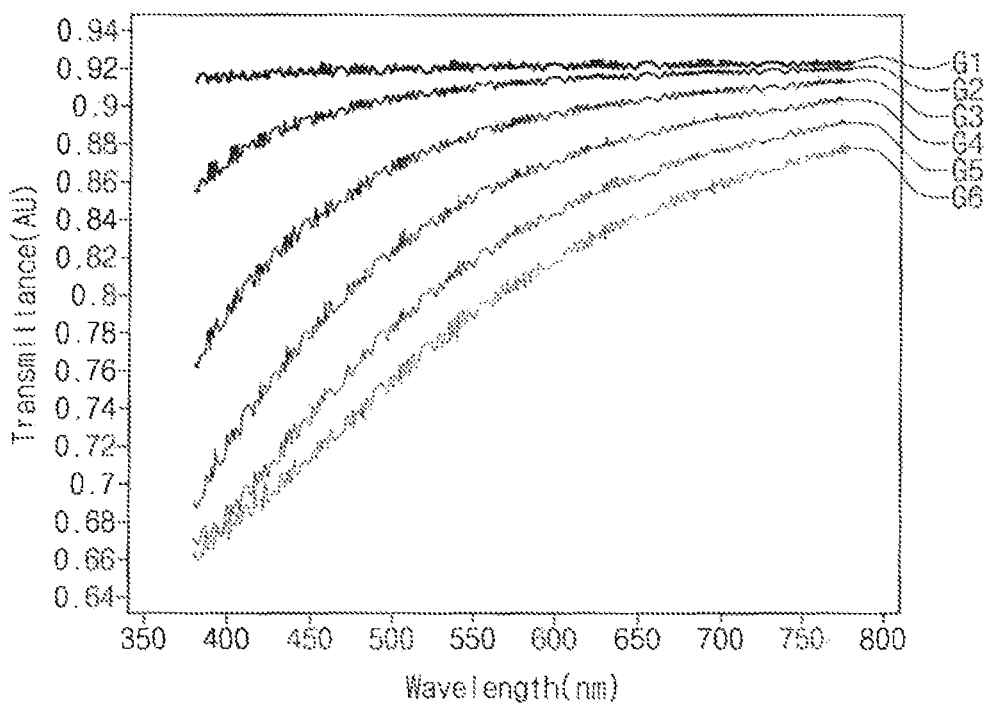
FIG. 9 is a graph of light transmittance as a function of wavelength for a plurality of thicknesses of a transparent conductive material, according to an embodiment of the present disclosure.
Figure 10A:
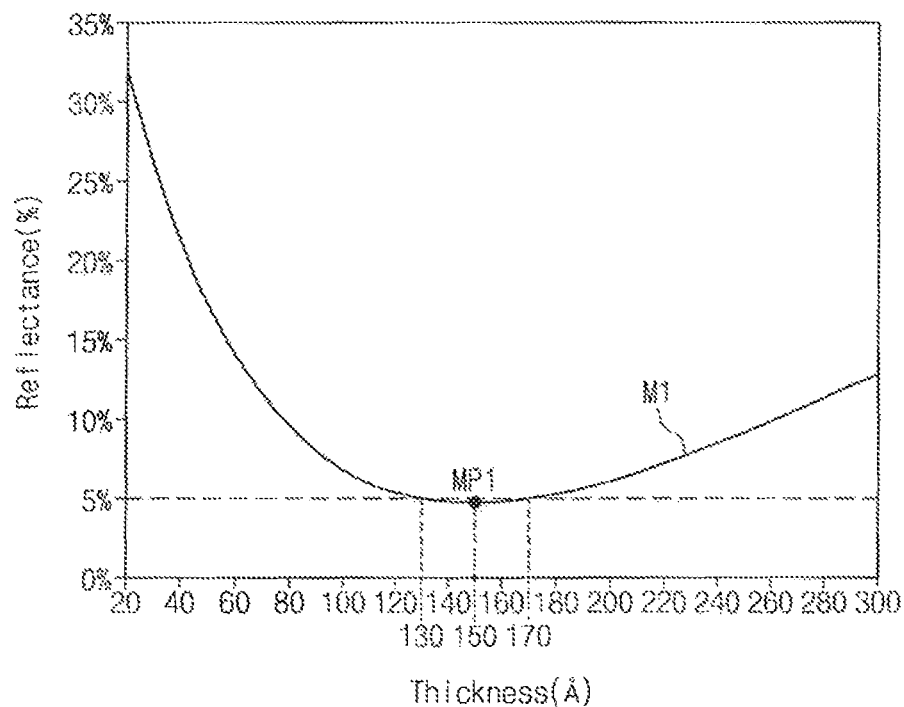
FIGS. 10A and 10B are graphs of light reflectance as a function of a thickness variation of a metal and a transparent conductive material according to an embodiment of the present disclosure.
Figure 10B:
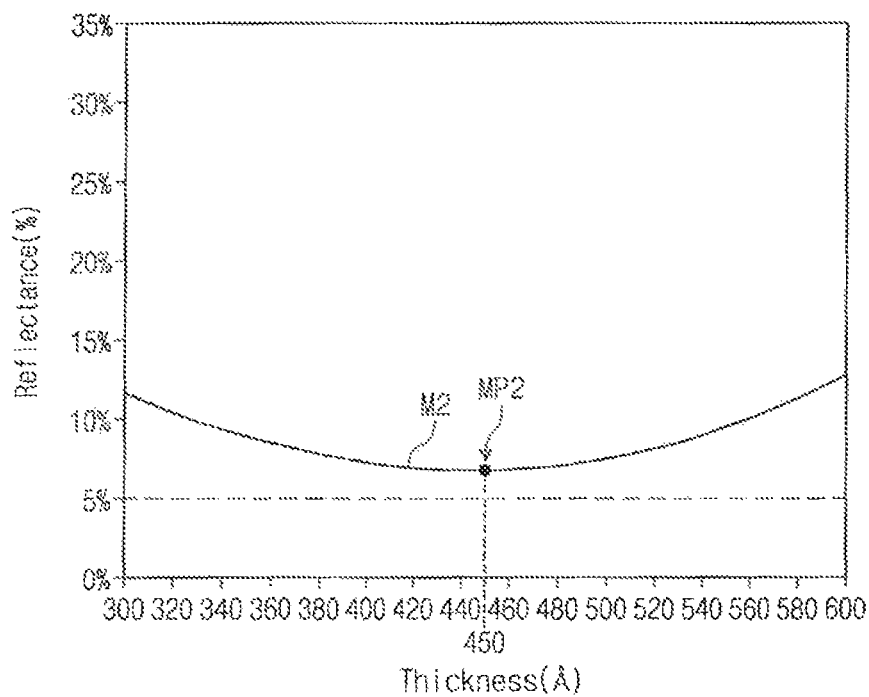

FIG. 7 is an enlarged cross-sectional view of a portion of a display device according to an embodiment of the present disclosure. FIG. 8 is a graph of light transmittance as a function of a thickness variation of a transparent conductive material according to an embodiment of the present disclosure. FIG. 9 is a graph of light transmittance for each wavelength as a function of a thickness variation of a transparent conductive material according to an embodiment of the present disclosure. FIGS. 10A and 10B are graphs of light reflectance as a function of a thickness variation of a metal and a transparent conductive material according to an embodiment of the present disclosure. In FIGS. 7 to 9, 10A, and 10B, the same reference numerals denote the same elements in FIGS. 5 and 6A to 6D, and thus, detailed descriptions of the same elements will be omitted.

Referring to FIG. 7, in an embodiment, a display panel DP further includes an optical compensation layer OCL. The optical compensation layer OCL is disposed on a first inclined portion SA_a and does not overlap an opening portion OPR in a first area TA. The optical compensation layer OCL overlaps a portion of a first light blocking area SAR_a, however, embodiments of the present disclosure are not limited thereto. According to embodiments, the optical compensation layer OCL might not overlap the first light blocking area SAR_a or may overlap the first light blocking area SAR_a.

In an embodiment, the optical compensation layer OCL is disposed on a second inorganic layer IM2. The optical compensation layer OCL does not overlap a first dam layer DAM_a.

Letting a thickness OCT of the optical compensation layer OCL be defined as a second thickness OCT, the second thickness OCT of the optical compensation layer OCL is uniform.

In an embodiment, the optical compensation layer OCL includes a transparent conductive material. For example, the optical compensation layer OCL includes at least one of indium zinc oxide (IZO) or indium tin oxide (ITO), etc. When the inorganic layer includes indium zinc oxide, the optical compensation layer OCL has the second thickness OCT of several hundreds angstroms and a width SCW of tens to hundreds micrometers (μm). In detail, the optical compensation layer OCL has the second thickness OCT of about 100 to about 400 angstroms (Å) and the width OCW of about 50 to about 500 micrometers (μm).

In an embodiment, the optical compensation layer OCL includes a metal. For example, the optical compensation layer OCL includes titanium. When the optical compensation layer OCL includes titanium, the optical compensation layer OCL has the second thickness OCT of tens to hundreds angstroms and the width OCW of tens to hundreds micrometers (μm). In detail, the optical compensation layer OCL has the second thickness OCT of about 50 to about 200 angstroms (Å) and the width OCW of about 50 to about 500 micrometers (μm). However, embodiments of the present disclosure are not limited thereto, and in other embodiments, the second thickness OCT and the width OCW of the optical compensation layer OCL can vary depending on the type of the material included in the optical compensation layer OCL. For example, in an embodiment, the optical compensation layer OCL includes both a metal and a transparent conductive material. For example, the optical compensation layer OCL includes indium zinc oxide and titanium.

When the optical compensation layer OCL has the second thickness (XT of tens to hundreds angstroms, the thickness of an encapsulation layer ENP is not uniform, and thus, an empty space EPR may form between an input sensor layer ISP and an anti-reflective layer RPL. The empty space EPR is included in the gap AG (see FIG. 4).

However, in an embodiment, when the optical compensation layer OCL includes a metal or a transparent conductive material, an amount of external light NL (see FIG. 2) reflected in the electronic device ED and propagating outward is reduced by the optical compensation layer OCL. In detail, since the optical compensation layer OCL has a transmittance that is less than that of the encapsulation layer ENP or the input sensor layer ISP, the amount of reflected external light NL that passes through the optical compensation layer OCL is reduced. In addition, since the optical compensation layer OCL has a reflectance that is less than that of a circuit element layer DP-CL or a pixel layer DP-OLED, external light NL incident into the electronic device ED can be prevented from being reflected by the optical compensation layer OCL and being perceived by a user.

In an embodiment, the display panel DP includes a planarization layer CPL. The planarization layer CPL is disposed on the encapsulation layer ENP and the optical compensation layer OCL in the first area TA.

FIG. 8 is a graph T1 that represents a transmittance variation as a function of a thickness variation of indium zinc oxide. The graph T1 is referred to as a transmittance graph T1. The transmittance of indium zinc oxide is indicated by the absorbance (AU) on the vertical axis, and the thickness of the indium zinc oxide is indicated on the horizontal axis in units of Angstroms. For example, the transmittance graph T1 shows the absorbance when the light has a wavelength of about 550 nm.

According to the transmittance graph T1, as the thickness of the indium zinc oxide increases, the transmittance decreases. In detail, the transmittance when the thickness of the indium zinc oxide is about 400 angstroms (Å) is less than the transmittance when the thickness of the indium zinc oxide is about 100 angstroms (Å) by about 0.1 AU.

The transmittance of the optical compensation layer OCL is controlled by changing the second thickness OCT (see FIG. 7) of the optical compensation layer OCL (see FIG. 7) by taking into account the transmittance graph T1.

FIG. 9 shows graphs G1, G2, G3, G4, G5, and G6 of light transmittance as a function of wavelength for a plurality of thicknesses of indium zinc oxide, according to an embodiment of the present disclosure.

The graph G1 represents a transmittance variation as a function of wavelength when the thickness of the indium zinc oxide is about 10 angstroms (Å), and is referred to as a first wavelength graph G1. The graph G2 represents a transmittance variation as a function of wavelength when the thickness of the indium zinc oxide is about 100 angstroms (Å), and is referred to as a second wavelength graph G2. The graph G3 represents a transmittance variation as a function of wavelength when the thickness of the indium zinc oxide is about 200 angstroms (Å), and is referred to as a third wavelength graph G3. The graph G4 represents a transmittance variation as a function of wavelength when the thickness of the indium zinc oxide is about 300 angstroms (Å), and is referred to as a fourth wavelength graph G4. The graph G5 represents a transmittance variation as a function of wavelength when the thickness of the indium zinc oxide is about 400 angstroms (Å), and is referred to as a fifth wavelength graph G5.

The graph G6 represents a transmittance variation as a function of wavelength when the thickness of the indium zinc oxide is about 500 angstroms (Å), and is referred to as a sixth wavelength graph G6.

According to the first to sixth wavelength graphs G1 to G6, as the wavelength of the light increases, the transmittance of the indium zinc oxide increases. In addition, as the thickness of the indium zinc oxide increases, the transmittance of the indium zinc oxide decreases.

In detail, when comparing the second wavelength graph G2 with the sixth wavelength graph G6, it is observed that the transmittance when the thickness of the indium zinc oxide is about 500 angstroms (Å) is generally lower than the transmittance when the thickness of the indium zinc oxide is about 100 angstroms (Å). In addition, according to the sixth wavelength graph G6, when the thickness of the indium zinc oxide is about 500 angstroms (Å), it is observed that the transmittance of light having a wavelength of about 400 nm is less than the transmittance of light having a wavelength of about 650 nm.

According to an embodiment, the transmittance of the optical compensation layer OCL is controlled by changing the second thickness OCT (see FIG. 7) of the optical compensation layer OCL (see FIG. 7) by taking into account the first to sixth wavelength graphs G1 to G6.

In addition, the second thickness OCT of the optical compensation layer OCL can change depending on a wavelength variation of the external light NL reflected in the electronic device ED.

FIG. 10A shows a graph M1 of light reflectance as a function of a thickness variation of titanium, according to an embodiment of the present disclosure. The graph M1 is referred to as a first reflection graph M1.

Referring to FIG. 10A, the first reflection graph M1 has a convex downward shape in a section where the titanium thickness is within a range from about 20 angstroms (Å) to about 300 angstroms (Å). As can be seen from the graph, the reflectance of titanium has a minimum value when the titanium thickness is in a range between about 100 angstroms (Å) to about 200 angstroms (Å), as compared with the reflectance when the titanium thickness is less than about 100 angstroms (Å) or greater then about 200 angstroms (Å). In detail, titanium is formed to have a thickness between about 130 angstroms (Å) to about 170 angstroms (Å) to allow titanium to have a reflectance equal to or less than about 5%. For example, letting the transmittance when titanium has a thickness of about 150 angstroms (Å) be referred to as a first transmittance MP1, the first transmittance MP1 has a value of about 4.6%.

FIG. 10B shows a graph M2 of light reflectance as a function of a thickness variation of indium zinc oxide, according to an embodiment of the present disclosure. The graph M2 is referred to as a second reflection graph M2.

Referring to FIG. 10B, the second reflection graph M2 has a convex downward shape in a section where the thickness of indium zinc oxide is within a range from about 300 angstroms (Å) to about 600 angstroms (Å). As can be seen from the graph, the reflectance of indium zinc oxide has a minimum value when indium zinc oxide has the thickness in a range from about 300 angstroms (Å) to about 600 angstroms (Å). For example, letting the transmittance when indium zinc oxide has a thickness of about 450 angstroms (Å) be referred to as a second transmittance MP2, the second transmittance MP2 has a value of about 6.76%.

According to an embodiment, when the optical compensation layer OCL (see FIG. 7) includes a metal or a transparent conductive material, the optical compensation layer OCL can be formed by calculating the width OCW (see FIG. 7) and the second thickness OCT (see FIG. 7) with reference to the graphs shown in FIGS. 8, 9, 10A, and 10B.

FIG. 11 is a cross-sectional view of the display device taken along a line II-II' in FIG. 2. In FIG. 11, the same reference numerals denote the same elements in FIGS. 2, 3, and 5, and thus, detailed descriptions of the same elements will be omitted. In addition, for the convenience of description, the circuit element layer DP-CL, the pixel layer DP-OLED, and the input sensor layer ISP are briefly illustrated, and the adhesive layer AF is omitted.

Referring to FIG. 11, according to an embodiment, the display panel DP further includes a second dam layer DAM_b disposed on the base layer BL in the first non-display area BZA. The second dam layer DAM_b is referred to as a protruding portion. The second dam layer DAM_b may have a stack structure of a plurality of insulating layers or may have a single-layer structure. The second dam layer DAM_b defines an area in which the organic layer OL is disposed.

According to an embodiment, the first inorganic layer IML1 is disposed on the display element layer OLED. The organic layer OL is disposed on the first inorganic layer IML1. The second dam layer DAM_b allows the organic layer OL to overlap only a portion of the first non-display area BZA when the organic layer OL is deposited. The organic layer OL overlaps the second area DA and a portion of the first non-display area BZA and includes a second inclined portion SA_b. The second inclined portion SA_b overlaps a portion of the first non-display area BZA.

According to an embodiment, the organic layer OL is encapsulated by the second dam layer DAM_b and the first and second inorganic layers IML1 and IML2 disposed on the second dam layer DAM_b.

According to an embodiment, a height of the second inclined portion SA_b with respect to the upper surface of the base layer BL decreases with a decreasing distance from the first non-display area BZA. However, the first and second inorganic layers IML1 and IML2 each have a uniform thickness. The second inorganic layer IM2 is disposed on the organic layer OL.

According to an embodiment, the display panel DP further includes a second inclination compensation layer SCL_2. The second inclination compensation layer SCL_2 is disposed on the second inclined portion SA_b in the first non-display area BZA and does not overlap the second dam layer DAM_b. The second inclination compensation layer SCL_2 overlaps a portion of a second light blocking area SAR_b. The second inclination compensation layer SCL_2 is disposed on the second inorganic layer IM2.

According to an embodiment, as a height of the second inclined portion SA_b decreases, a thickness of the second inclination compensation layer SCL_2 disposed on the second inclined portion SA_b increases. Accordingly, a step difference or an inclination of the second inclined portion SA_b is compensated for by the second inclination compensation layer SCL_2.

According to an embodiment, the window WM includes a second light blocking pattern SHP_b. The second light blocking pattern SHP_b is disposed in the first non-display area BZA. The second light blocking pattern SHP_b overlaps a portion of the second inclined portion SA_b and the second dam layer DAM_b. An area in which the second light blocking pattern SHP_b is disposed is referred to as the second light blocking area SAR_b. In the second light blocking area SAR_b, external light incident into the electronic device ED is blocked by the second light blocking pattern SHP_b. In addition, when external light is reflected in the electronic device ED outward toward the second light blocking area SAR_b, the external light is blocked.

According to an embodiment, the anti-reflective layer RPL prevents external light incident into the electronic device ED and reflected by the electrodes in the circuit element layer DP-CL and the pixel layer DP-OLED from being perceived by the user.

According to an embodiment, when the encapsulation layer ENP includes the second inclined portion SA_b, a sensor layer inclined portion that corresponds to the second inclined portion SA_b is formed in the input sensor layer ISP disposed on the encapsulation layer ENP. Accordingly, a separation phenomenon in which the anti-reflective layer RPL disposed on the input sensor layer ISP separates from the sensor layer inclined portion of the input sensor layer ISP can occur, and thus, an empty space may be formed. When the empty space is formed, reflected external light may be additionally refracted or diffracted due to differences in refractive indices between the encapsulation layer ENP or the input sensor layer ISP and air in the empty space. Due to this optical phenomenon, external light may exit from the anti-reflective layer RPL without being blocked by the anti-reflective layer RPL. In particular, in a structure in which the second light blocking pattern SHP_b does not to completely overlap the second inclined portion SA_b, external light exiting through the anti-reflective layer RPL is not blocked by the second light blocking pattern SHP_b and can be perceived by a user.

For example, in an embodiment, when the second inclination compensation layer SCL_2 is disposed on the second inclined portion SA_b, the separation phenomenon can be prevented from occurring. For example, the second inclination compensation layer SA_b has a thickness that increases as the height of the second inclined portion SA_b decreases, and thus, the separation phenomenon can be prevented. Accordingly, external light reflected in the electronic device ED can be blocked by the anti-reflective layer RPL in an area of the first non-display area BZA other than the second light blocking area SAR_b.

Although the embodiments of the present disclosure have been described, it is understood that a scope of the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display device, comprising:
a display panel that includes a first area and a second area that surrounds at least a portion of the first area, the display panel comprising:
 a base layer;
 a display element layer disposed on the base layer in the second area;
 an encapsulation layer disposed on the display element layer wherein the encapsulation layer includes an opening portion that corresponds to the first area and an inclined portion that has a height that decreases with decreasing distance from the opening portion;
 an inclination compensation layer that is disposed on the inclined portion and does not overlap the opening portion; and
 a planarization layer disposed on the encapsulation layer in the first area, and comprising an organic material,
 wherein the inclination compensation layer is directly disposed between the encapsulation layer and the planarization layer, and is covered by the planarization layer.

2. The display device of claim 1, wherein the encapsulation layer comprises:
 a first inorganic layer disposed on the display element layer;
 an organic layer disposed on the first inorganic layer; and
 a second inorganic layer disposed on the organic layer, wherein the inclined portion is formed by the organic layer.

3. The display device of claim 2, wherein the inclination compensation layer is disposed on the second inorganic layer.

4. The display device of claim 2, wherein the display panel further comprises a dam layer disposed on the base layer in the first area wherein the dam layer defines an area in which the organic layer is disposed, and the inclination compensation layer does not overlap the dam layer.

5. The display device of claim 1, wherein the inclination compensation layer has a thickness that increases with a decreasing height of the inclined portion.

6. The display device of claim 1, further comprising a light blocking pattern, wherein the display panel includes a panel hole formed in the opening portion, and the light blocking pattern is disposed in the first area and does not overlap the panel hole.

7. The display device of claim 6, wherein the inclination compensation layer overlaps a portion of the light blocking pattern.

8. A display device, comprising:
a display panel that includes a first area and a second area that surrounds at least a portion of the first area, the display panel comprising:
 a base layer;
 a display element layer disposed on the base layer in the second area;
 an encapsulation layer disposed on the display element layer wherein the encapsulation layer includes an opening portion that corresponds to the first area and an inclined portion that has a height that decreases with decreasing distance from the opening portion;
 an optical compensation layer disposed along the inclined portion and that does not overlap the opening portion; and
 a planarization layer disposed on the encapsulation layer in the first area, and comprising an organic material,
 wherein the optical compensation layer is directly disposed between the encapsulation layer and the planarization layer, and is covered by the planarization layer.

9. The display device of claim 8, wherein the encapsulation layer comprises:
 a first inorganic layer disposed on the display element layer;
 an organic layer disposed on the first inorganic layer; and
 a second inorganic layer disposed on the organic layer, wherein the inclined portion is formed by the organic layer.

10. The display device of claim 9, wherein the optical compensation layer is disposed on the second inorganic layer.

11. The display device of claim 8, wherein the optical compensation layer comprises a transparent conductive material.

12. The display device of claim 11, wherein the optical compensation layer comprises indium zinc oxide.

13. The display device of claim 8, wherein the optical compensation layer comprises a metal.

14. The display device of claim 13, wherein the optical compensation layer comprises titanium.

15. A display device, comprising:
a display panel that includes a display area in which an image is displayed and a non-display area adjacent to the display area, the display panel comprising:
   a base layer;
   a display element layer disposed on the base layer in the display area;
   an encapsulation layer disposed on the display element layer wherein the encapsulation layer includes an inclined portion in the non-display area;
   an inclination compensation layer disposed in the non-display area and that overlaps the inclined portion; and
   a planarization layer disposed on the encapsulation layer in the non-display area, and comprising an organic material,
   wherein the inclination compensation layer is directly disposed between the encapsulation layer and the planarization layer, and is covered by the planarization layer,
   wherein the encapsulation layer comprises:
      a first inorganic layer disposed on the display element layer;
      an organic layer disposed on the first inorganic layer; and
      a second inorganic layer disposed on the organic layer,
      wherein the inclined portion is formed by the organic layer, and the inclination compensation layer is disposed on the second inorganic layer.

16. The display device of claim 15, wherein the display panel further comprises a dam layer disposed on the base layer in the non-display area wherein the dam layer defines an area in which the organic layer is disposed, and the inclination compensation layer does not overlap the dam layer.

17. The display device of claim 16, wherein the inclined portion has a height that decreases with decreasing distance between the inclined portion and the dam layer, and the inclination compensation layer has a thickness that increases with decreasing height of the inclined portion.

18. The display device of claim 15, further comprising an input sensor layer disposed directly on the encapsulation layer.

* * * * *